United States Patent
Sterling et al.

(10) Patent No.: US 7,959,735 B2
(45) Date of Patent: Jun. 14, 2011

(54) SUSCEPTOR WITH INSULATIVE INSERTS

(75) Inventors: William N. Sterling, Santa Clara, CA (US); Lan Duong, Saratoga, CA (US); Gaku Furuta, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 283 days.

(21) Appl. No.: 11/672,955

(22) Filed: Feb. 8, 2007

(65) Prior Publication Data

US 2008/0194169 A1 Aug. 14, 2008

(51) Int. Cl.
C23C 16/00 (2006.01)
H01L 21/683 (2006.01)
H01T 23/00 (2006.01)

(52) U.S. Cl. ...................... 118/728; 361/234
(58) Field of Classification Search .................. 118/728; 361/234
See application file for complete search history.

(56) References Cited

U.S. PATENT DOCUMENTS

| | | | | |
|---|---|---|---|---|
| 4,872,947 A * | 10/1989 | Wang et al. | | 216/38 |
| 5,124,717 A * | 6/1992 | Campanelli et al. | | 347/93 |
| 5,309,538 A * | 5/1994 | Larson | | 385/98 |
| 5,366,585 A | 11/1994 | Robertson et al. | | |
| 5,558,717 A * | 9/1996 | Zhao et al. | | 118/715 |
| 6,024,044 A | 2/2000 | Law et al. | | |
| 6,110,557 A * | 8/2000 | Weir et al. | | 428/830 |
| 6,228,438 B1 * | 5/2001 | Schmitt | | 427/569 |
| 6,246,567 B1 | 6/2001 | Parkhe | | |
| 6,494,958 B1 * | 12/2002 | Shamouilian et al. | | 118/728 |
| 6,773,562 B1 | 8/2004 | Inagawa et al. | | |
| 6,847,516 B2 * | 1/2005 | Kwon et al. | | 361/234 |
| 6,893,162 B2 * | 5/2005 | Vegny et al. | | 385/59 |
| 7,086,347 B2 | 8/2006 | Howald et al. | | |
| 2003/0031792 A1 | 2/2003 | Won et al. | | |
| 2003/0036877 A1 * | 2/2003 | Schietinger | | 702/134 |
| 2004/0190215 A1 * | 9/2004 | Weldon et al. | | 361/234 |
| 2005/0272273 A1 * | 12/2005 | Shang et al. | | 438/788 |
| 2006/0005771 A1 * | 1/2006 | White et al. | | 118/728 |
| 2006/0014842 A1 * | 1/2006 | Li et al. | | 521/61 |
| 2006/0057826 A1 * | 3/2006 | De Boer | | 438/482 |
| 2006/0060302 A1 | 3/2006 | White et al. | | |
| 2006/0185795 A1 | 8/2006 | Choi et al. | | |
| 2006/0207508 A1 | 9/2006 | Leung | | |
| 2006/0254512 A1 * | 11/2006 | Fink | | 118/715 |

* cited by examiner

*Primary Examiner* — Keath T Chen
*Assistant Examiner* — Michael Cleveland
(74) *Attorney, Agent, or Firm* — Patterson & Sheridan, L.L.P.

(57) ABSTRACT

A method and apparatus for reducing arcing in a plasma processing system when processing large area substrates which contain one or more holes. In one embodiment of the invention, a substrate support member includes an electrically insulating insert located beneath a hole in an insulating, large area substrate. The insulating insert is made of aluminum oxide, and is located within a hole in the support member such that the insert is disposed beneath a hole in a glass substrate. The substrate support member is made of aluminum with an anodized surface.

17 Claims, 17 Drawing Sheets

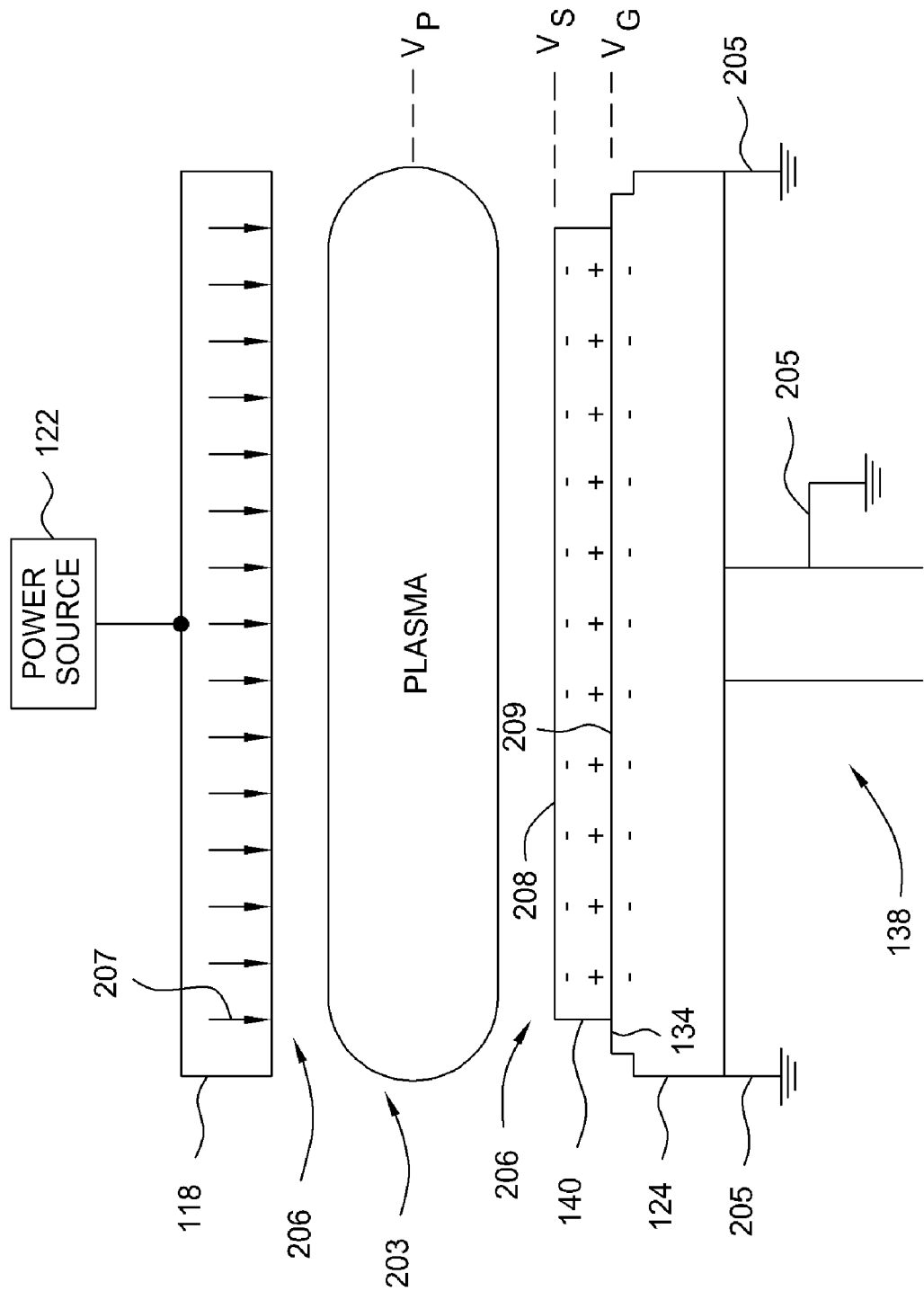

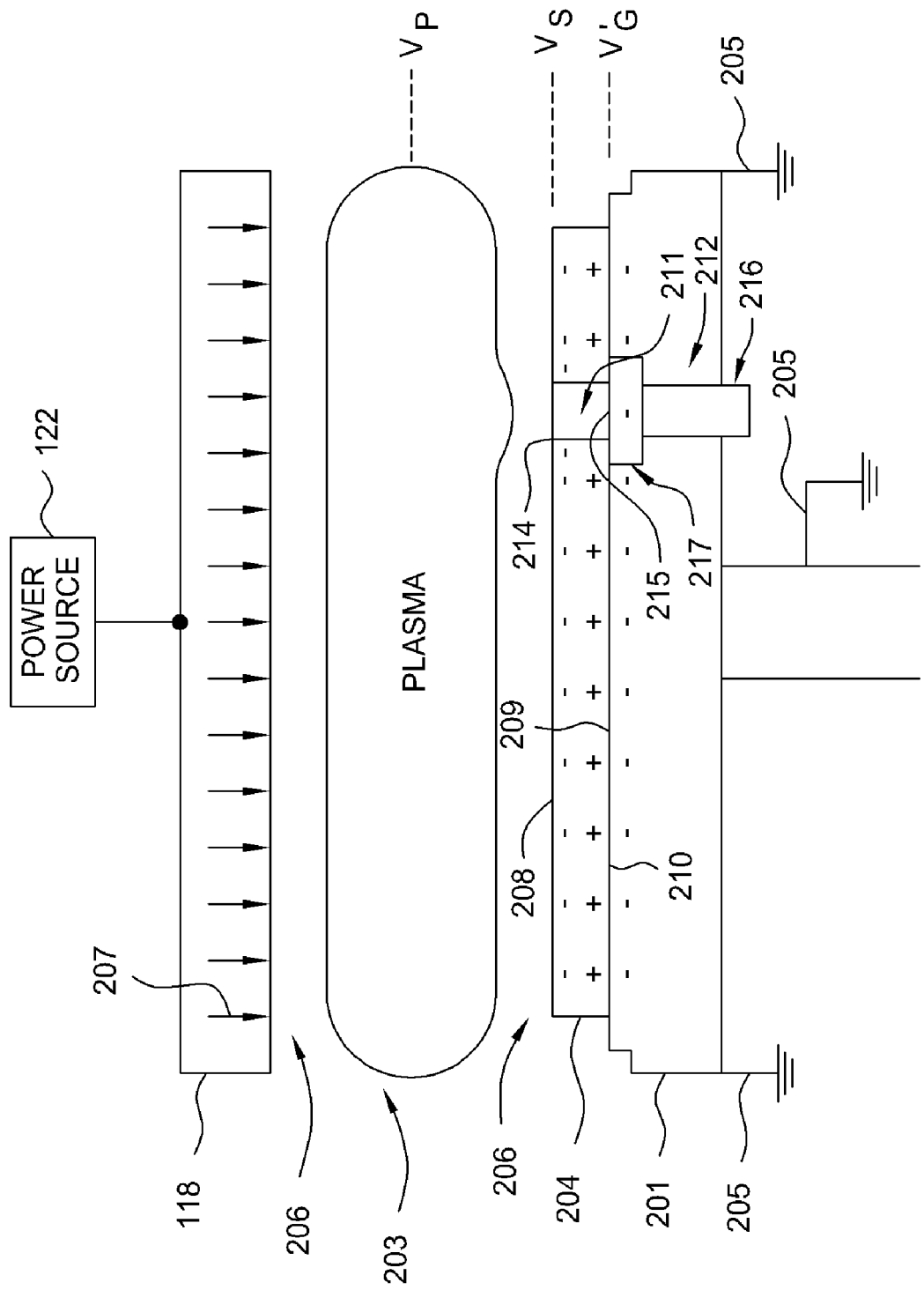

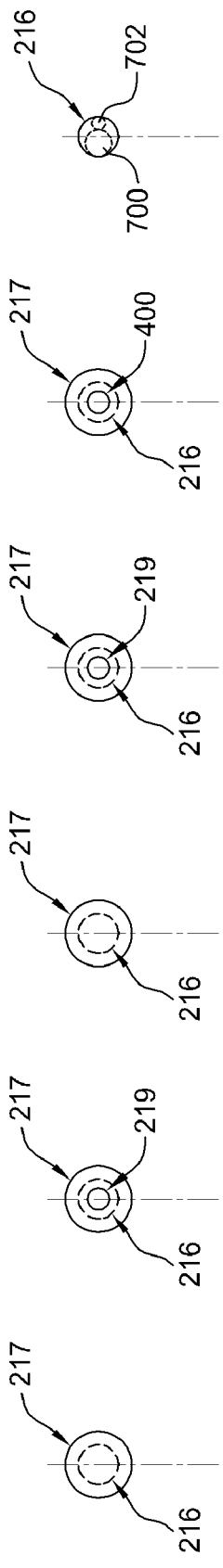
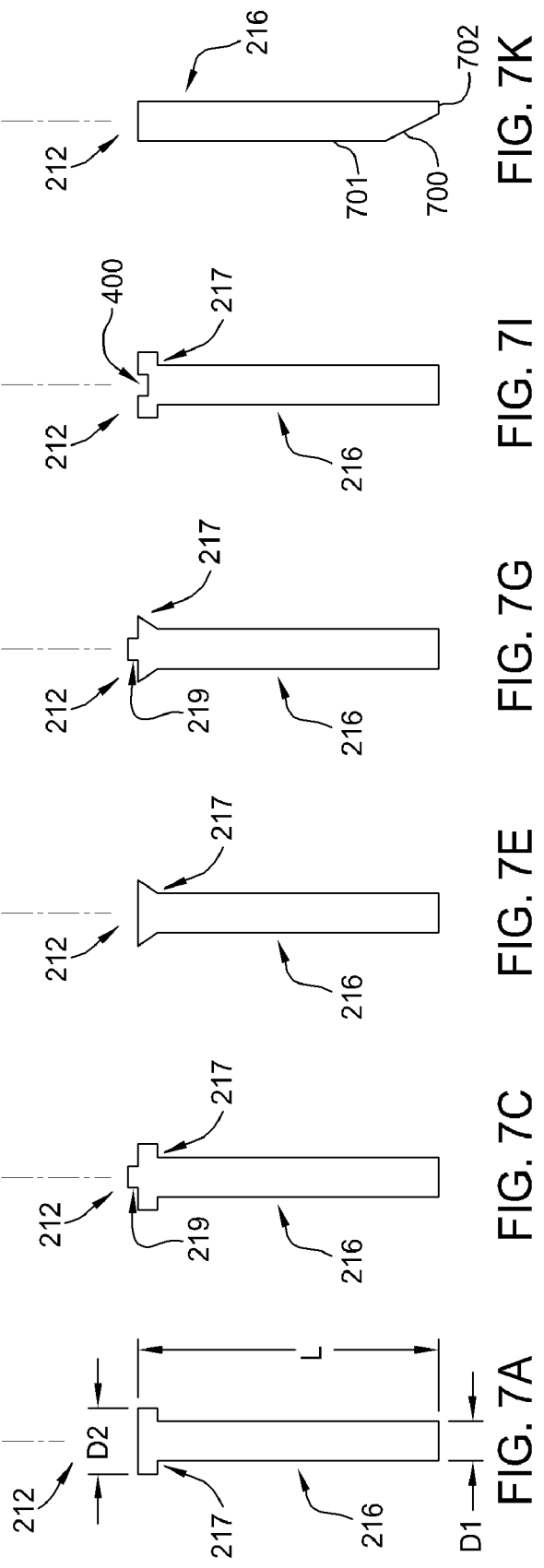

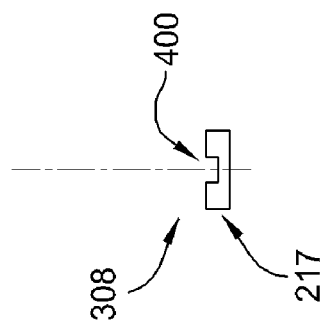
FIG. 8J
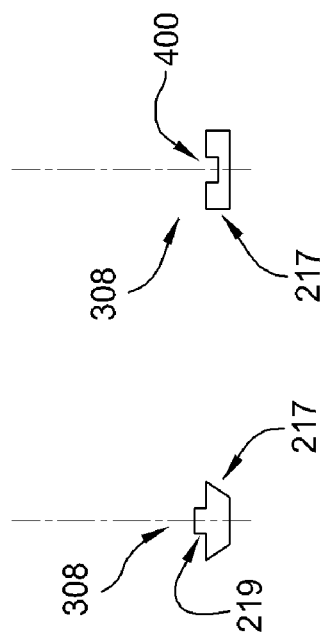
FIG. 8I
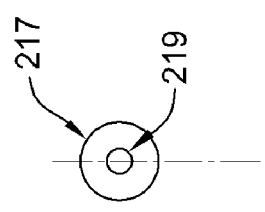
FIG. 8H
FIG. 8G
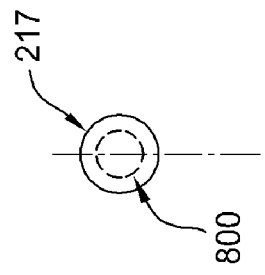
FIG. 8F
FIG. 8E
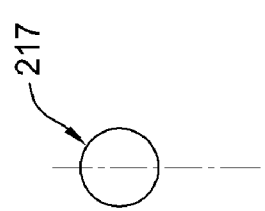
FIG. 8D
FIG. 8C
FIG. 8B
FIG. 8A

SUSCEPTOR WITH INSULATIVE INSERTS

BACKGROUND OF THE INVENTION

1. Field of the Invention

Embodiments of the present invention generally relate to substrate processing systems used for fabricating flat panel displays, semiconductor wafers, and solar panels. In particular, embodiments of the invention relate to substrate supports used in such processing systems.

2. Description of the Related Art

Flat panel displays encompass a growing number of technologies, such as plasma displays, organic light-emitting diode displays, and liquid crystal displays, to name a few. Liquid crystal displays are commonly used for active matrix displays such as computer and television monitors, digital cameras, and an increasing number of other devices. Generally, liquid crystal displays comprise two glass plates having a layer of liquid crystal materials sandwiched therebetween. At least one of the glass plates includes at least one conductive film disposed thereon that is coupled to a power supply. Power, supplied to the conductive film from the power supply, changes the orientation of the crystal material, creating a pattern such as text or graphics seen on the display. One fabrication process frequently used in the production of active matrix displays is plasma enhanced chemical vapor deposition (PECVD).

Plasma enhanced chemical vapor deposition is generally used to deposit thin films on a substrate such as a semiconductor wafer or flat panel glass substrate. In general, PECVD processing involves positioning a substrate on a temperature controlled, heated substrate support, frequently referred to as a susceptor or heater, disposed in a vacuum chamber, and striking a plasma adjacent to the upper exposed surface of the substrate. The plasma is formed by introducing precursor gas into the vacuum chamber and exciting the gas with an electric field using a radio frequency (RF) source coupled to the chamber. The electric field causes the precursor gas to form reactive species which then react to form a film layer on the substrate. The use of a plasma to energize (i.e., excite) the precursor gas allows film deposition to occur at lower temperatures than would be possible using only a heated substrate support to drive the deposition reactions. Plasma processing is particularly well-suited for the production of a flat panel display since the substrate used is typically large and thermally insulative (e.g., glass) and susceptible to warping and bowing if thermal gradients exist within the substrate.

However, the use of plasma processing for large area substrates which are made of electrically insulating materials (e.g., glass and plastic) can lead to charging effects and, in some cases, arcing which may not observed for smaller size substrates or substrates made of semiconducting or conducting materials. Additionally, certain flat panel display applications may require the use of large area, insulating substrates which require placement of a hole or holes within the substrate prior to processing. The hole or holes may be used to facilitate substrate alignment, fixturing, packaging, or other later processing steps for the substrate. The discontinuity in electrical properties for a substrate surface that contains holes may cause non-uniformity in charging effects and differences in electrical potential which may lead to arcing in a plasma processing environment.

Therefore, there is a need for an improved substrate support that reduces arcing during the processing of substrates.

SUMMARY OF THE INVENTION

A method and apparatus for reducing arcing when processing substrates which may contain one or more holes is provided for a plasma processing system. In one embodiment, a substrate support is adapted to support a large area substrate with a hole in said substrate, and the substrate support includes an electrically conductive body having a substrate support surface, an electrically insulating coating disposed on the body, and an electrically insulating insert disposed within a hole in the conductive body with each insert located beneath a hole in the substrate.

In another embodiment, method is provided to reduce arcing in a plasma processing chamber when processing a substrate with one or more holes in said substrate. The method includes positioning a substrate support body in a processing volume, wherein the substrate support body includes one or more holes, with each hole corresponding to each hole in a substrate, and each hole of the substrate support body having an electrically insulating insert placed therein, and positioning a substrate with one or more holes on a supporting surface of the support body such that each insert is located beneath a hole in the substrate.

In another embodiment of the invention, a plasma processing chamber is adapted to process a large area substrate with a hole in said substrate, comprising one or more walls forming a processing volume, a substrate support disposed in the processing volume, a substrate support body having a substrate support surface and disposed in the processing volume, and an electrically insulating insert disposed within a hole in the support body, and said insert located beneath a hole in the substrate.

In yet another embodiment, an electrically insulating insert adapted to fit within a hole in a substrate supporting body, and said insert located beneath a hole in a substrate, comprising a head and a stem.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 2A is a cross-sectional schematic view of one embodiment of a plasma processing system for the chamber depicted in FIG. 1, according to the present invention.

FIG. 2C is a schematic cross-sectional view of another embodiment of a plasma processing system for the chamber depicted in FIG. 1, according to the present invention, for a substrate with a thru hole located over an insulating insert.

FIG. 7A is a side view of one embodiment for an insulating insert, according to the present invention.

FIG. 7B is a plan view of the insulating insert shown in FIG. 7A.

FIG. 7C is a side view of another embodiment for an insulating insert, according to the present invention.

FIG. 7D is a plan view of the insulating insert shown in FIG. 7C.

FIG. 7E is a side view of another embodiment for an insulating insert, according to the present invention.

FIG. 7F is a plan view of the insulating insert shown in FIG. 7E.

FIG. 7G is a side view of another embodiment for an insulating insert, according to the present invention.

FIG. 7H is a plan view of the insulating insert shown in FIG. 7G.

FIG. 7I is a side view of another embodiment for an insulating insert, according to the present invention.

FIG. 7J is a plan view of the insulating insert shown in FIG. 7I.

FIG. 7K is a side view of another embodiment for an insulating insert, according to the present invention.

FIG. 7L is a plan view of the insulating insert shown in FIG. 7K.

FIG. 8A is a side view of one embodiment for an insulating insert which has no stem, according to the present invention.

FIG. 8B is a plan view of the insulating insert shown in FIG. 8A.

FIG. 8C is a side view of another embodiment for an insulating insert which has no stem, according to the present invention.

FIG. 8D is a plan view of the insulating insert shown in FIG. 8C.

FIG. 8E is a side view of another embodiment for an insulating insert which has no stem, according to the present invention.

FIG. 8F is a plan view of the insulating insert shown in FIG. 8E.

FIG. 8G is a side view of another embodiment for an insulating insert which has no stem, according to the present invention.

FIG. 8H is a plan view of the insulating insert shown in FIG. 8G.

FIG. 8I is a side view of another embodiment for an insulating insert which has no stem, according to the present invention.

FIG. 8J is a plan view of the insulating insert shown in FIG. 8I.

Figure 1:
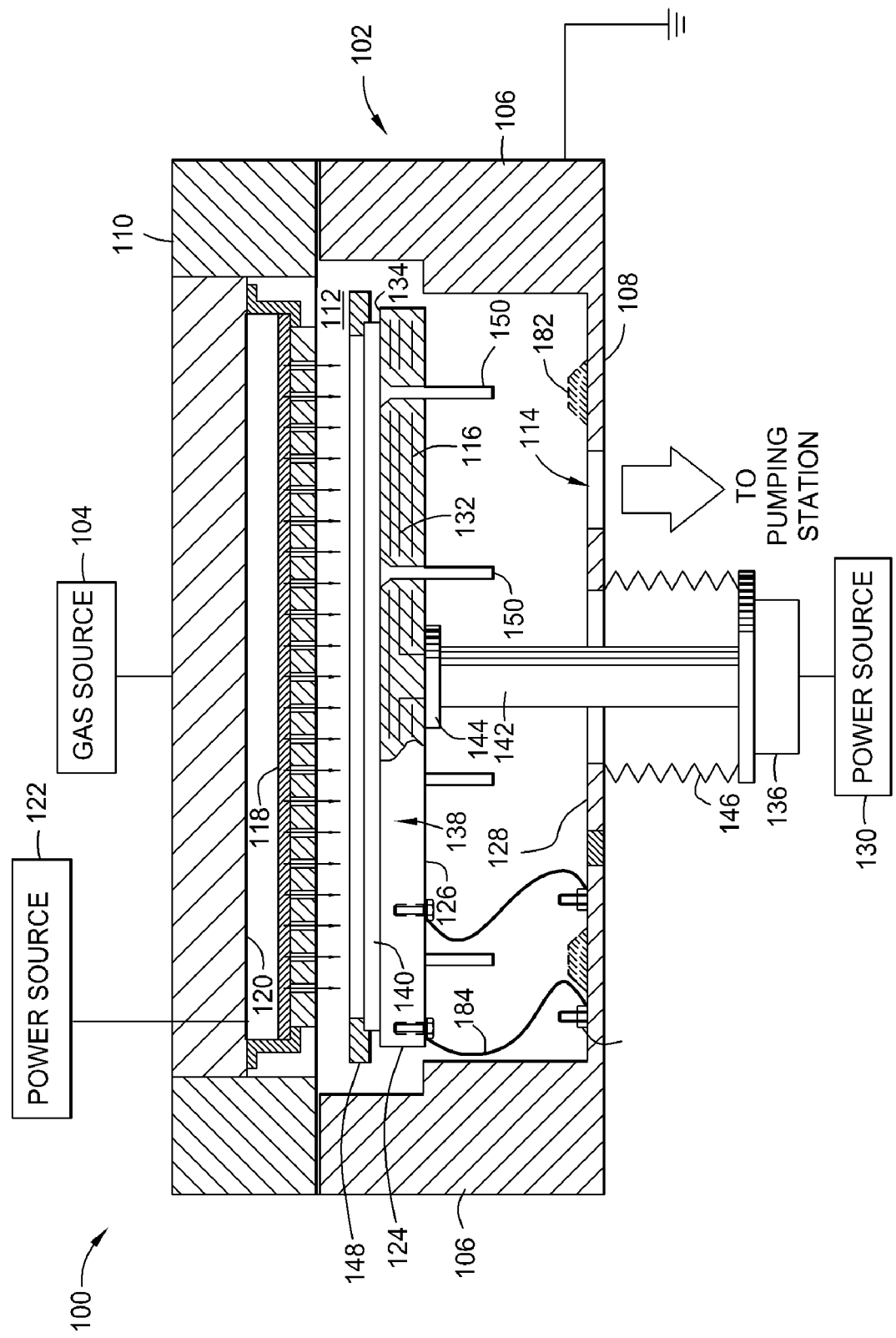
FIG. 1 is a cross-sectional view of one embodiment of a plasma enhanced chemical vapor deposition processing chamber.

To facilitate understanding, identical reference numerals have been used, where possible, to designate identical elements that are common to the figures. It is to be noted, however, that the appended drawings illustrate only typical embodiments of this invention and are therefore not to be considered limiting of its scope, for the invention may admit to other equally effective embodiments.

DETAILED DESCRIPTION

The invention generally relates to a plasma processing chamber and a method and apparatus for reducing arcing when processing large area substrates which may contain one or more holes. Although the invention is illustratively described, shown and practiced within a large area substrate processing system, the invention may find utility in other plasma processing chambers where it is desirable to ensure that the chance for arcing is reduced when processing substrates.

FIG. 1 is a cross sectional view of one embodiment of a plasma enhanced chemical vapor deposition system 100. The system 100 generally includes a chamber body 102 coupled to a gas source 104. The chamber body 102 has walls 106, a chamber bottom 108 and a lid assembly 110 that define a process volume 112. The process volume 112 is typically accessed through a port (not shown) in the walls 106 that facilitates movement of a large area substrate 140 into and out of the chamber body 102. The walls 106 and chamber bottom 108 are typically fabricated from a unitary block of aluminum or other material compatible for processing. The chamber bottom 108 of the chamber body 102 has a pumping port 114 formed therethrough that couples the process volume 112 to a pumping system (not shown) to facilitate control of pressure within the process volume 112 and exhaust gases and byproducts during processing.

The lid assembly 110 is supported by the walls 106 and can be removed to service the chamber body 102. The lid assembly 110 is generally comprised of aluminum. A gas distribution plate 118 (e.g., showerhead) is coupled to an interior side 120 of the lid assembly 110. The gas distribution plate 118 is typically fabricated from aluminum. The center section includes a perforated area through which process and other gases supplied from the gas source 104 are delivered to the process volume 112. The perforated area of the gas distribution plate 118 is configured to provide uniform distribution of gases passing through the gas distribution plate 118 into the chamber body 102.

The heated substrate support assembly 138 (also referred to as a "substrate support" or "susceptor") is centrally disposed within the chamber body 102 and supports the substrate 140 during processing. The substrate support assembly 138 generally includes a substrate support body 124 which is electrically conductive supported by a shaft 142 that extends through the chamber bottom 108. The substrate support body 124 is generally polygonal in shape and covered with an electrically insulative coating (not shown) over at least the portion of the substrate support body 124 that supports the substrate 140. The coating may also cover other portions of the substrate support body 124. The substrate support assembly 138 is normally coupled to ground at least during processing.

The substrate support body 124 may be fabricated from metals or other comparably electrically conductive materials. The insulative coating may be a dielectric material such as an oxide, silicon nitride, silicon dioxide, aluminum dioxide, tantalum pentoxide, silicon carbide or polyimide, among others, which may be applied by various deposition or coating processes, including, but not limited to, anodization, flame spraying, plasma spraying, high energy coating, chemical vapor deposition, spraying, adhesive film, sputtering and encapsulating. In one embodiment, the substrate support body 124 is fabricated from aluminum and then anodized to provide an electrically insulative coating.

In one embodiment, the substrate support body 124 encapsulates at least one embedded heating element 132 and a thermocouple (not shown). The substrate support body 124 may include one or more stiffening members 116 comprised of metal, ceramic or other stiffening materials embedded therein.

The heating element 132, such as an electrode or resistive element, is coupled to a power source 130 and controllably heats the support assembly 138 and substrate 140 positioned thereon to a predetermined temperature. Typically, the heating element 132 maintains the substrate 140 at a uniform temperature of about 150 to at least about 460 degrees Celsius during processing. The heating element 132 is electrically floating relative to the substrate support body 124.

Generally, the support assembly 138 has a lower side 126 and an upper surface 134 that supports the substrate 140 thereon. The lower side 126 has a stem cover 144 coupled thereto. The stem cover 144 generally is an aluminum ring coupled to the support assembly 138 that provides a mounting surface for the attachment of the shaft 142 thereto.

Generally, the shaft 142 extends from the stem cover 144 through the chamber bottom 108 and couples the support assembly 138 to a lift system 136 that moves the support assembly 138 between an elevated process position (as shown) and a lowered position that facilitates substrate transfer. A bellows 146 provides a vacuum seal between the process volume 112 and the atmosphere outside the chamber body 102 while facilitating the vertical movement of the support assembly 138. The shaft 142 additionally provides a conduit for electrical and thermocouple leads between the support assembly 138 and other components of the system 100.

The shaft 142 may be electrically isolated from the chamber body 102. In the embodiment depicted in FIG. 1, a dielectric isolator 128 is disposed between the shaft 142 and chamber body 102. The dielectric isolator 128 may additionally support or be configured to function as a bearing for the shaft 142.

The support assembly 138 additionally supports a circumscribing shadow frame 148. Generally, the shadow frame 148 prevents deposition at the edge of the substrate 140 and support assembly 138 so that the substrate 140 does not stick to the support assembly 138.

The support assembly 138 has a plurality of holes disposed therethrough that accept a plurality of lift pins 150. The lift pins 150 are typically comprised of ceramic or anodized aluminum and have first ends that are substantially flush with or slightly recessed from the upper surface 134 of the support assembly 138 when the lift pins 150 are in a normal position (i.e., retracted relative to the support assembly 138). The first ends are generally flared to prevent the lift pins 150 from falling through the holes. As the support assembly 138 is lowered to a transfer position, the lift pins 150 come in contact with the chamber bottom 108 of the chamber body 102 and are displaced through the support assembly 138 to project from the upper surface 134 of the support assembly 138, thereby placing the substrate 140 in a spaced-apart relation to the support assembly 138.

In one embodiment, lift pins 150 of varying lengths (as shown in FIG. 1) are utilized so that they come into contact with the chamber bottom 108 and are actuated at different times. For example, the lift pins 150 that are spaced around the outer edges of the substrate 140, combined with relatively shorter lift pins 150 spaced inwardly from the outer edges toward the center of the substrate 140, allow the substrate 140 to be first lifted from its outer edges relative to its center. In another embodiment, lift pins 150 of a uniform length may be utilized in cooperation with bumps or plateaus 182 (shown in phantom) positioned beneath the outer lift pins 150, so that the outer lift pins 150 are actuated before and displace the substrate 140 a greater distance from the upper surface 134 than the inner lift pins 150. Alternatively, the chamber bottom 108 may comprise grooves or trenches positioned beneath the inner lift pins 150, so that the inner lift pins 150 are actuated after and displaced a shorter distance than the outer lift pins 150. Embodiments of a system having lift pins configured to lift a substrate in an edge to center manner from a substrate support that may be adapted to benefit from the invention are described in U.S. patent application Ser. No. 10/308,385 filed Dec. 2, 2002 by Shang, et al., and described in U.S. patent application Ser. No. 10/460,196 filed Jun. 12, 2003 by Blonigan, et al., both of which are hereby incorporated by reference in there entireties.

The support assembly 138 is generally grounded during processing such that an RF power supplied by the power source 122 to the gas distribution plate 118 (or other electrode positioned within or near the lid assembly 110 of the chamber body 102) may excite the gases disposed within the process volume 112 between the support assembly 138 and the gas distribution plate 118. The RF power from the power source 122 is generally selected commensurate with the size of the substrate 140 to drive the chemical vapor deposition process.

In one embodiment, the substrate support assembly 138 is grounded by one or more RF ground return path members 184 that provide a low-impedance RF return path between the substrate support body 124 and ground. The RF ground return path members 184 may be coupled directly or indirectly to ground, for example, through the chamber body 102. In one embodiment, the RF ground return path members 184 are a plurality of flexible straps (two of which are shown in FIG. 1) coupled between a perimeter of the substrate support body 124 and the chamber bottom 108.

The use of multiple RF ground path return members 184 helps ensure that the substrate support body 124 is properly RF grounded to prevent a voltage drop across the substrate support which may affect deposition uniformity. Additionally, ineffective RF grounding allows plasma to travel to the side and below the substrate support to make unwanted deposition in those areas, which makes chamber cleaning more difficult and time-consuming. However, plasma processing of large, insulating substrates, such as glass substrates, can create charging effects and undesirable potential differences even when a substrate support is well-grounded. In some cases, the potential differences may grow large enough to cause arcing.

FIG. 2A is a cross-sectional schematic view of one embodiment of a plasma processing system for the chamber depicted in FIG. 1, according to the present invention. One method for producing a plasma is through capacitive coupling which uses conducting, parallel plate electrodes. Capacitive coupling in a plasma enhanced chemical vapor deposition (PECVD) chamber is generally accomplished by coupling a radio frequency (RF) power source 122 and matching circuit (not shown) to one electrode disposed above a second electrode which is grounded. The electrodes are typically several inches apart, but the gap may be adjustable to optimize process conditions. In the present embodiment, an power source 122 is connected to a gas distribution plate 118 (e.g., showerhead) which acts as a first electrode, and a substrate support body 124, which acts as a second electrode, is connected to ground 205. As shown in FIG. 2A, the substrate support body 124 may be grounded at multiple locations to provide better grounding. In other embodiments of the present invention, the power source 122 may be a DC power supply.

Plasma formation begins by introducing a process gas 207 into the reaction chamber. In the foregoing discussion, it is to be understood that the process gas comprises molecules, or atoms, or both. The chamber is typically at reduced pressure to facilitate plasma formation. A power source 122 applies a voltage across the gas distribution plate 118 and the substrate support body 124 which function as electrodes. In the present embodiment, the power source 122 is a radio frequency power supply. In other embodiments of the present invention, the power source 122 may be a DC power supply. The applied voltage creates an electric field which accelerates any electrons between the electrodes. These electrons may originate from ionization of neutral species by cosmic rays or background radiation, or by field emission caused by strong electric fields around a sharp point at the electrode surface. As each electron accelerates, it may eventually acquire sufficient kinetic energy to ionize a gas molecule through an inelastic collision. Such a collision releases another electron, which also accelerates and collides with another gas molecule, which in turn releases another electron and so on, creating a cascade effect whereby many gas molecules may be ionized and form a plasma, which may be defined as a partially ionized gas containing about equal numbers of positive and negative particles.

As electrons collide with process gas molecules, dissociation reactions occur among many of the gaseous reactants, creating highly reactive species. The electron-impact dissociation of the process gas provides a portion of the activation energy needed for the film deposition reaction. The use of a plasma to provide this energy allows the deposition reactions to occur at temperatures lower than what would be possible if all the energy were provided by thermal processes alone. Deposition at lower temperatures helps prevent temperature gradients from developing within large, insulating (e.g., glass) substrates and also protects heat-sensitive devices and structures on the substrate. In one embodiment of the present invention, the gaseous reactants may include silane-containing precursor gases for depositing silicon-containing films, such as silicon dioxide, among others.

To sustain film deposition at lower temperatures, electron collisions with process gas molecules need to be sustained to drive the creation of reactive species within the plasma. However, electrons are continuously being lost to the chamber walls, to recombination with positive ions, and to other reactions that result in electron capture. To sustain the plasma, this electron loss must be offset by electron generation. In addition to the cascade effect mentioned previously, electrons may also be generated when electrons or ions strike an electrode surface and cause a secondary electron to be ejected back into the plasma. When electron generation equals or exceeds electron loss, the plasma has ignited.

Ignition of a plasma is dependent upon the gas pressure in the reaction chamber. If the gas pressure is too high, the electrons will have too many low energy collisions and will not be able to acquire sufficient kinetic energy to cause ionization of gas molecules. If the gas pressure is too low, electrons will travel ballistically without colliding with enough gas molecules to sustain the cascade and the plasma will fail to ignite. These two pressure limitations create a process window for gas pressure that will produce plasma ignition. In one embodiment, the pressure may range from 0.3 Torr to 10 Torr. In other embodiments, other pressures may be used. This type of low pressure plasma is sometimes referred to as a glow-discharge plasma.

The structure of the glow-discharge plasma is dependent on electron motion. Referring to FIG. 2A, at the start of plasma formation the plasma 203 will tend to diffuse outward to the gas distribution plate 118 and substrate support body 124 (the plate and body each acting as an electrode), and the chamber walls (not shown). Since the electrons are much less massive than the ions, the electrons have a much higher thermal velocity relative to the ions. This difference in velocity causes the electrons to lead the ions in diffusion so that the plasma 203 is at an electric potential which is positive relative to the electrodes and chamber walls. This implies that for an electrically isolated (or insulative) substrate 140 that rests on one of the electrodes (substrate support body 124), the substrate surface will be bombarded by electrons and will charge negatively with respect to the plasma 203. The excess negative charge density around the substrate 140 is called the sheath region 206 (sometimes referred to as "dark space"), and the substrate 140 will continue to charge negatively until the net charge flux into the sheath region 206 goes to zero. At this point, the isolated substrate 140 has an electric potential Vs at top substrate surface 208 and plasma 203 has electric potential $V_P$. The plasma 203 approximates an equipotential region due to its high conductivity relative to the sheath region 206. Also, a sheath region 206 forms around the other electrode (gas distribution plate 118), but may have a different electric potential. One of the key features of a glow-discharge plasma is that a sheath region surrounds any surface in contact with the plasma, and most of the voltage applied between the electrodes is dropped across the sheath regions. For the sheath region 206 around substrate 140, the voltage drop is $V_P$–$V_S$, and this voltage drop is the potential through which a positive ion is accelerated to the substrate 204. The potential $V_G$ at the upper surface 134 of the substrate support body 124 may not equal $V_S$, especially if the substrate is made of an insulating material, such as glass or plastic.

The use of a radio frequency power source 122 to drive the plasma implies that the values for potentials $V_P$, $V_S$, and $V_G$ will change instantaneously, but every surface that comes in contact with the plasma will be surrounded by a sheath region, and the bulk plasma 203 will be more positive than the most positive of the containing surfaces.

In FIG. 2A, a substrate 140 rests on a substrate support body 124. In the present embodiment, the substrate may be any electrically insulating, non-metallic material such as an oxide-based material or a plastic. For example, the oxide-based substrate may be glass, quartz, or a ceramic material. In other embodiments, the substrate may be a semiconductor material. An insulating substrate 140 will typically acquire a negative charge along the top substrate surface 208 due to greater electron mobility within the processing plasma and as a result of sheath formation. Since the substrate is insulating, accumulated negative charge at top substrate surface 208 cannot be readily discharged through the grounded substrate support body 124. The negative charge at top substrate surface 208 may induce a positive charge at the bottom substrate surface 209 of the substrate, which in turn may induce a negative charge at the upper surface 134 of the substrate support body 124. The force of electrostatic attraction between the bottom substrate surface 209 and upper surface 134 may be sufficient to prevent separation of the substrate 140 from the substrate support body 124 without damaging the substrate 140. In such cases, it may be necessary to dissipate the charge on the substrate before the substrate is removed from the chamber. Embodiments of such charge dissipation methods are described in U.S. patent application Ser. No. 09/927,698 filed Jul. 27, 2001 by Won, et. al.

Figure 2B:
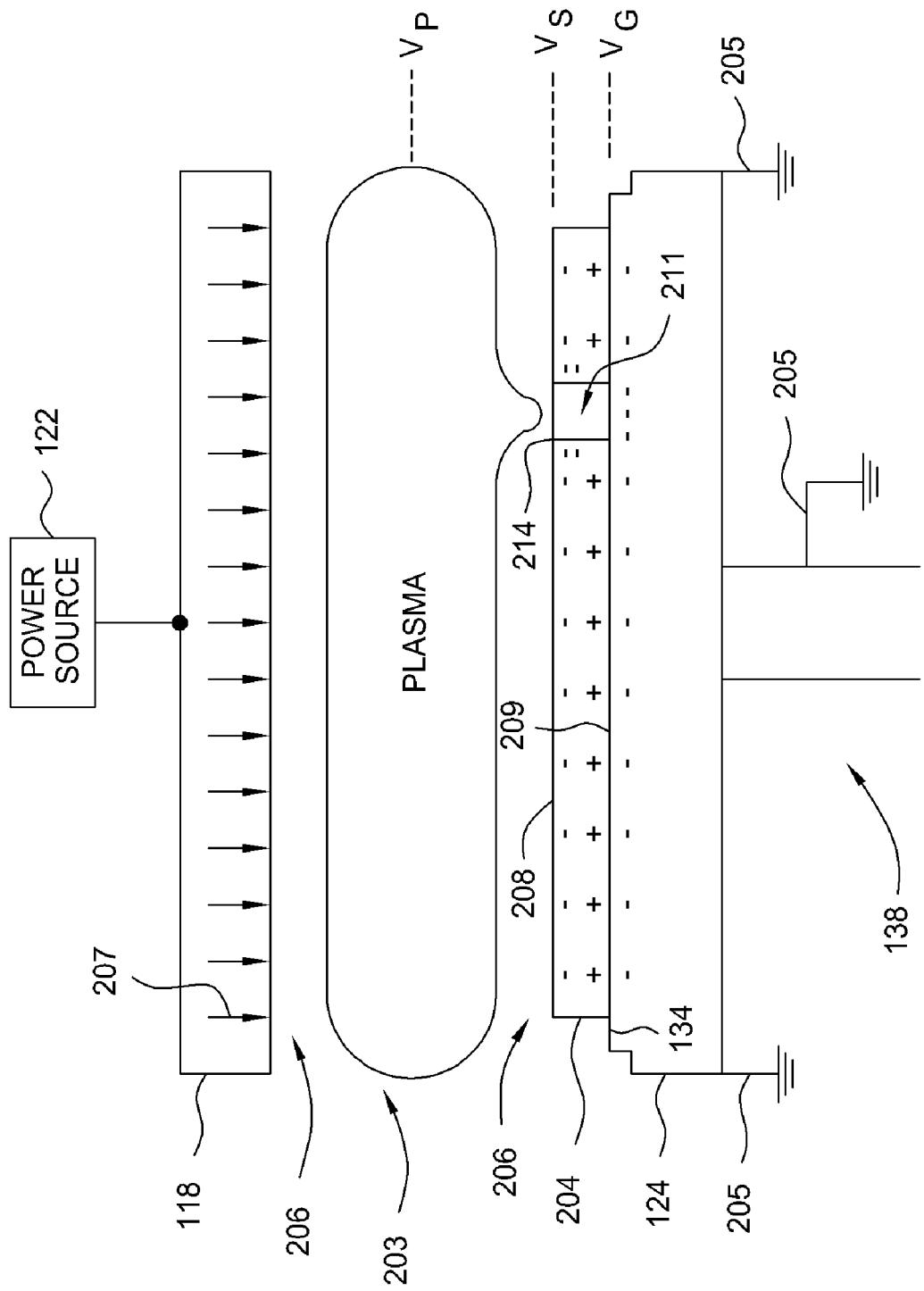
FIG. 2B is a schematic cross-sectional view of one embodiment of a plasma processing system for the chamber depicted in FIG. 1, according to the present invention, for a substrate with a thru hole.

FIG. 2B is a schematic cross-sectional view of one embodiment of a plasma processing system for the chamber depicted in FIG. 1, for a substrate 204 which has a substrate hole 211 through said substrate, according to the present invention. As before, sheath region 206 formation tends to charge the substrate negatively, and all surfaces in contact with the plasma are surrounded by a sheath. If the sheath width is not significantly greater than the substrate hole 211 diameter, the sheath edge may begin to penetrate the hole. Secondary electrons can now be ejected from the sidewalls of the hole, and this may increase the plasma density and, therefore, conductivity within the hole. The increased conductivity preferentially attracts the applied power, which may further enhance positive ion flux into the hole and creation of more secondary electrons. The net effect is that a "runaway" situation may develop which results in an arc-plasma at the substrate hole 211.

The charging of the substrate 204 and differences in potential at the top and bottom of the hole may also result in arcing. The top substrate surface 208 of the insulating substrate has electric potential $V_S$, and the upper surface 134 of the substrate support has electric potential $V_G$. Since the substrate support body 124 is grounded, Vs will tend to be greater than $V_G$ and $V_P-V_G>V_P-V_S$, and so positive ions may achieve greater velocities at the bottom of the substrate hole 211 and may produce more secondary electrons. Sheath formation will tend to negatively charge the upper edge 214 of the substrate hole 211 and the edge geometry may enhance charge density. In one embodiment, the substrate support body 124 may be made of aluminum with an anodized surface so that the top surface of the substrate support is electrically insulating and, therefore, would enhance negative charging at the bottom of the hole. The enhanced negative charge densities around the substrate hole 211 and greater potential drop $V_P-V_G$ may result in increased conductivity within the substrate hole 211, such that the plasma may begin to move into the hole and also grow in density which may result in arcing. The power applied by power source 122, the gas pressure, substrate hole 211 depth and other geometry, and other processing factors may determine if arcing actually occurs.

It has been observed by one of the inventors that under certain process conditions, no arcing is observed at the substrate hole 211. However, when a metallic paste (not shown) is applied at the hole edge and sidewalls, arcing results under the same process conditions. This effect may be due to higher charge densities at the surfaces of the conducting material, RF induced currents, shorter arc paths, field emission effects, or other mechanisms that may lead to arc breakdown. While not wishing to be bound by theory, it is believed that arcing occurs when a sufficiently high DC potential is allowed to build up across a dielectric layer. In the present example, the substrate 204 may act as the dielectric layer, and the grounded substrate support body 124 and metallic paste may provide surfaces at much lower or higher electrical potentials.

FIG. 2C is a schematic cross-sectional view of another embodiment of a plasma processing system for the chamber depicted in FIG. 1, according to the present invention, for a substrate with a thru hole located over an electrically insulating insert. In the present embodiment, a substrate support body 201 has a thru hole adapted to receive an insert 212 which is electrically insulating. The top surface 215 of the insert 212 may be located directly beneath the substrate hole 211, and the top surface 215 may be circular with a diameter larger than the substrate hole 211 to reduce the chance for arcing. In one embodiment, the insert is cylindrical in shape, with an upper portion or head 217 that is larger in diameter than a lower portion or stem 216. The substrate support body 201 may have a receiving hole with a counterbore at a top body surface 210 so that the insert 212 may be inserted into the substrate support body 201. In one embodiment, the insert 212 may be made of aluminum oxide ($Al_2O_3$) (e.g., alumina)

Referring to FIG. 2C, the presence of an electrically insulating insert 212 disposed beneath a substrate hole 211 in the substrate 204 may reduce arcing between the substrate 204 and the substrate support body 201. Plasma 203 formation will tend to negatively charge the top substrate surface 208, and a sheath region 206 will tend to form around the containing surfaces of the plasma 203 which may also lead to negative charging at the bottom of the substrate hole 211. In this case, however, the top surface 215 of an electrically insulating insert 212 acts as the substrate hole 211 bottom. The electrical potential at top substrate surface 208 is $V_S$, and the electrical potential at the top surface 215 of the insert is $V'_G$. When both the insert 212 and substrate 204 are made of electrically insulating materials, the electrical potential difference $V_S-V'_G$ may be sufficiently small to reduce the chance for arcing between these surfaces. In one embodiment, the substrate 204 may be made of glass, and the insert 212 may be made of aluminum oxide ($Al_2O_3$) (e.g., alumina). The dielectric constant for aluminum oxide may range from about 9.3 to 11.5 (at 1 mega-hertz), and the dielectric constant for glass may range from about 3.7-10, and so the dielectric properties of both substrate and insert may be sufficiently similar to inhibit arcing.

Figure 3A:
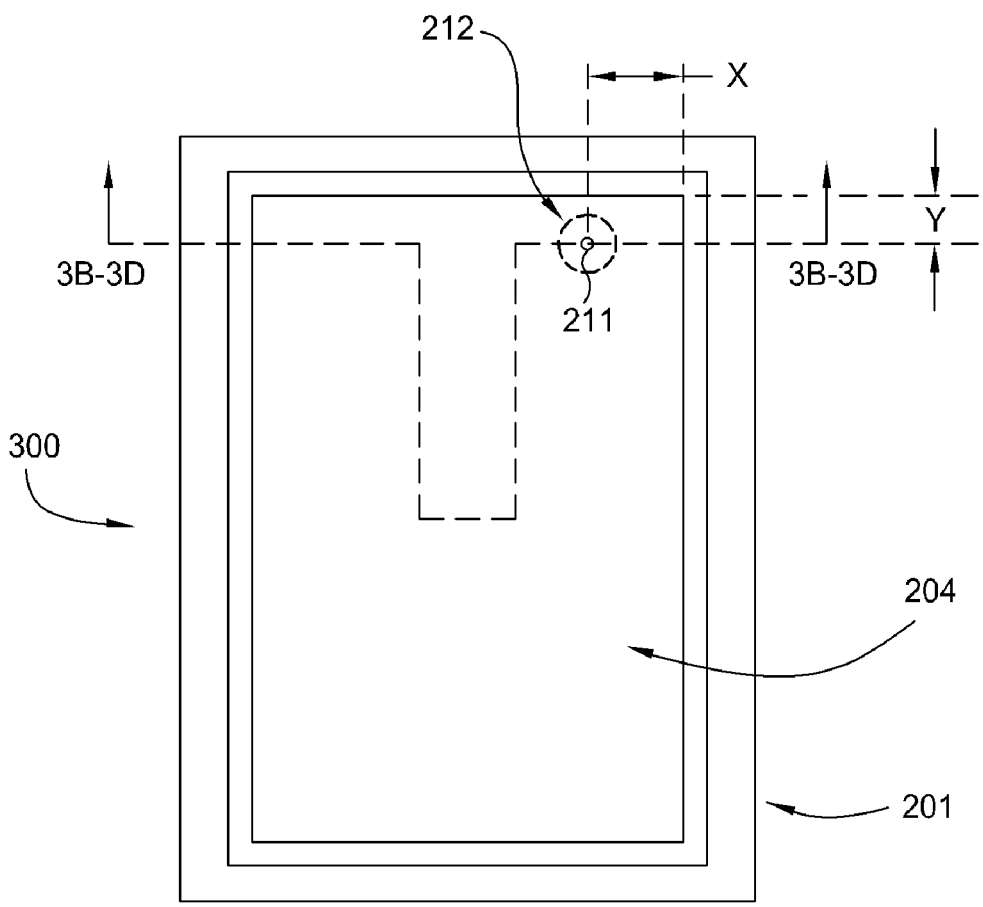
FIG. 3A is a schematic top view illustrating one embodiment of a substrate support.

FIG. 3A is a schematic top view illustrating one embodiment of a substrate support assembly 300, according to the present invention. A large area substrate 204 with a thru substrate hole 211 is disposed on a substrate support body 201. A dotted circle represents the circular cross section of an insulating insert 212 beneath the substrate hole 211. In one embodiment, the substrate thru substrate hole 211 is located at distances X and Y from a corner of the substrate 204. In one embodiment, the distance X may range from about 40 mm to about 60 mm, and the distance Y may range from about 42 mm to about 62 mm. In other embodiments, the thru substrate hole 211 may be located anywhere on the substrate 204. In one embodiment, the thru substrate hole 211 may have a diameter which is about 2 mm. In other embodiments, the substrate hole 211 may have other diameters. In yet other embodiments, the substrate 204 may include multiple thru substrate holes 211, and the hole sizes may vary from hole to hole. In the present embodiment, the large area substrate 204 may have an area which ranges from about 2000 cm$^2$ and above. In other embodiments, the large area substrate may have other area sizes. The substrate may be any electrically insulating, non-metallic material such as an oxide-based material or a plastic. For example, the oxide-based substrate may be glass, quartz, or a ceramic material. In other embodiments, the substrate may be a semiconductor material.

Figure 3B:
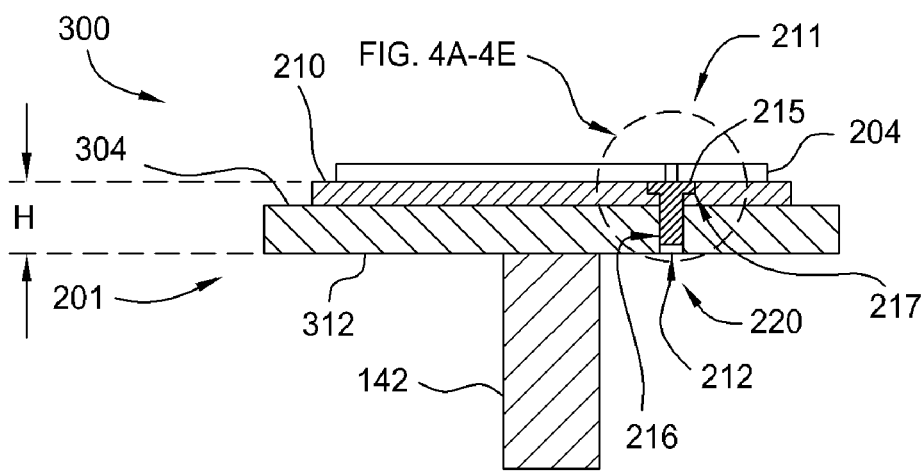
FIG. 3B is a schematic cross-sectional view of FIG. 3A for one embodiment of a substrate support which includes an insulating insert, according to the present invention.

FIG. 3B is a schematic cross-sectional view of FIG. 3A for one embodiment of a substrate support assembly 300 which includes an insulating insert 212, according to the present invention. The substrate support assembly 300 generally includes an electrically conductive, substrate support body 201 supported by a shaft 142. The substrate support body may include a upper body surface 304 and a top body surface 210 such that the substrate 204 is supported by the top body surface 210. The substrate support body 201 is generally polygonal is shape and covered with an electrically insulating coating (not shown) over at least the portion of the body that supports the substrate 204. The coating may also cover other portions of the substrate support body 201. In the present embodiment, the substrate support body 201 includes a thru hole 220 that accepts an electrically insulating insert 212 which is disposed beneath a substrate hole 211 so that arcing may be reduced within the processing chamber. In another embodiment, the substrate support body 201 may include multiple thru holes to accept multiple inserts 212 which may be disposed beneath multiple substrate holes 211. In yet another embodiment, the insert 212 sizes and corresponding substrate support body 201 hole diameters may vary from hole to hole when the substrate 204 includes multiple holes of varying sizes. In another embodiment, each substrate hole 211 of the substrate support body 201 may be sized according to the size of a corresponding substrate hole 211, and each insert 212 sized to fit each support body hole.

In one embodiment, the insert 212 may be cylindrical in cross-section, with said insert 212 comprising a head 217 (also referred to as "an upper portion") and a stem 216 (also referred to as "lower portion"), with the upper portion having a larger diameter than the diameter of the lower portion, and the substrate support body 201 including a hole suitably shaped and sized to receive the insert 212. In other embodiments, the insert 212 may have a hexagonal, oval, rectangular or other cross-section shape. In one embodiment, the stem 216 may not extend beyond the bottom surface 312 of substrate support body 201 when the overall length of the insert 212 is less than the hole length H. In another embodiment, the stem 216 may be of sufficient length so that it extends beyond the bottom surface 312 of the substrate support body 201 to facilitate access to or removal of the insert 212 from the substrate support body 201 but does not interfere with substrate lifting (see FIG. 1 and lift pins 150). In one embodiment, the head 217 may have a diameter of about 10 mm, and the stem 216 length may have a value of about 41 mm. In another embodiment, the head 217 may have a diameter ranging from about 1 mm to about 300 mm, and the stem 216 length may range from about 1 mm to about 100 mm. In the present embodiment, the head 217 of the insert 212 has a diameter which is larger than the diameter of the substrate hole 211 to reduce the chance for arcing. In other embodiments, the head 217 and stem 216 may have other shapes and lengths, and the receiving hole in the substrate support body 201 suitably adapted to accept the insert 212. The insert head 217 has a top surface 215 that is substantially flush with or slightly recessed from the top body surface 210 of the substrate support body 201 so that the insert head 217 does not raise any portion of the substrate 204 from the top body surface 210 when the insert is seated within substrate support body 201. In one embodiment, the insert 212 may be made of aluminum oxide ($Al_2O_3$) (e.g., alumina). The insert 212 may be made of other ceramic materials or other materials which are electrically insulating. In yet other embodiments, the insert 212 may be made of anodized aluminum, or another conducting material which is coated with an insulating, dielectric material. In yet other embodiments, the insert may be made of more than one material and have more than one type of coating.

The substrate support body 201 may be fabricated from metals or other comparably electrically conductive materials and the substrate support body 201 may be coated with an electrically insulating material. The coating material may be a dielectric material such as an oxide, silicon nitride, silicon dioxide, aluminum dioxide, or polymide, among others. In the present embodiment, the support body 201 is made of aluminum with an anodized surface. In one embodiment of the present invention, the substrate support assembly 300 and support body 201 may comprise the support assembly 138 depicted in FIG. 1 with a substrate support body 124 that has been suitably adapted to include one or more holes with an insert 212 for each hole.

Figure 3C:
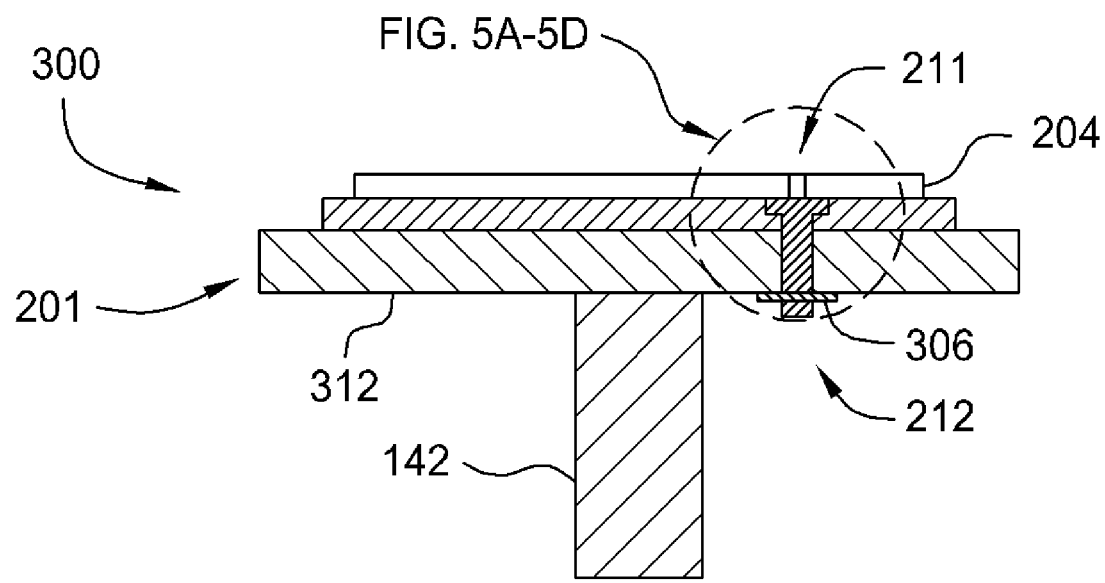
FIG. 3C is a schematic cross-sectional view of another embodiment of FIG. 3A for a substrate support which includes an insulating insert, according to the present invention.

FIG. 3C is a schematic cross-sectional view of another embodiment of FIG. 3A for a substrate support assembly 300 which includes an insulating insert, according to the present invention. The insulating insert 212 in FIG. 3B is shown placed within a receiving hole disposed in the support body 201. In one embodiment, the insert is made of aluminum oxide ($Al_2O_3$) (e.g., alumina), which has a thermal expansion coefficient of about $9 \times 10^{-6}$/Celsius degrees, and the support body is made of aluminum, which has a thermal expansion coefficient of about $23 \times 10^{-6}$/Celsius degrees. The difference in expansion coefficients implies that the insert 212 is typically not press fit into the receiving hole of the support body 201, but "floats" within the hole. To prevent the insert from inadvertently coming out of the hole, the insert 212 may be suitably adapted to include a retaining pin 306 or other means for keeping the insert 212 coupled to the support body 201.

Figure 3D:
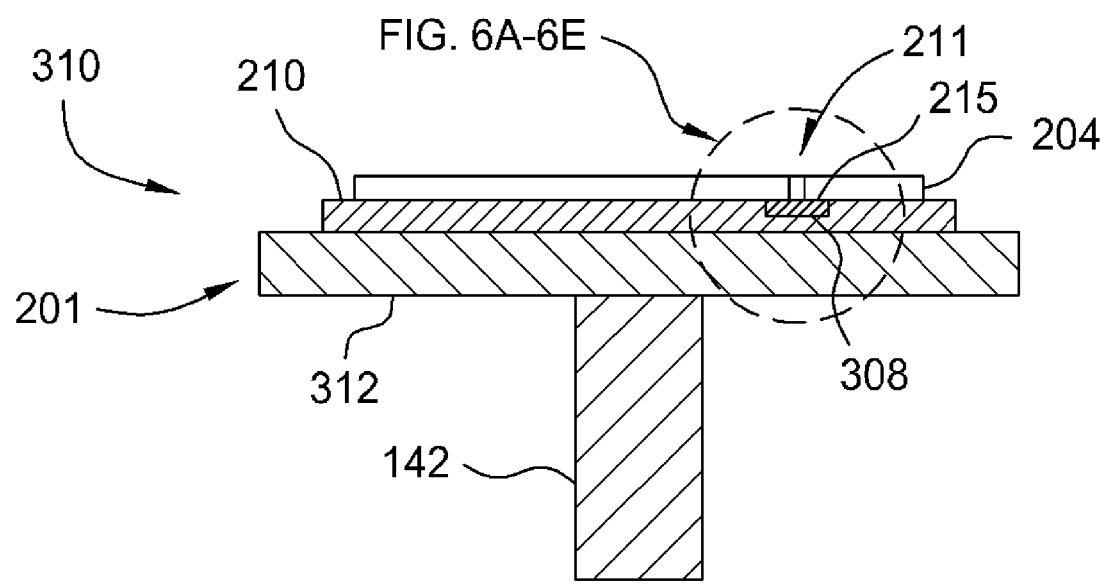
FIG. 3D is a schematic cross-sectional view of yet another embodiment of FIG. 3A for a substrate support which includes an insulating insert, according to the present invention

FIG. 3D is a schematic cross-sectional view of yet another embodiment of FIG. 3A for a substrate support assembly 310 which includes an insulating insert 212 which has no stem, and which has been re-labeled as 308, according to the present invention. The substrate support assembly 310 generally includes an electrically conductive, substrate support body 201 supported by a shaft 142. In one embodiment, the substrate support body 201 may encapsulate at least one embedded heating element (see 132 FIG. 1), a thermocouple (not shown), and one or more stiffening members (see 116 FIG. 1). Depending upon where the substrate hole 211 is located relative to the support body 201, it may be necessary to reduce the insulating insert length to avoid interference with any embedded elements. An insert 308, which may be shaped as a disk, may be located in a support body 201 which has a receiving recess, such as a shallow counterbore. The insert 308 shape and thickness and support body 201 recess depth may be adapted to avoid interfering with any embedded elements in the support body 201. In one embodiment, the insert 308 may have a cylindrical cross-section. In other embodiments, the insert 308 may have a hexagonal, oval, rectangular of other cross-section shape. In other embodiments, the insert 308 may have other shapes and thicknesses, and the receiving hole in the support body 201 suitably adapted to accept the insert 308. The insert head 217 has a top surface 215 that is substantially flush with or slightly recessed from the top body surface 210 of the support body 201 so that the insert head 217 does not raise any portion of the substrate 204 from the top body surface 210 when the insert is seated within body 201. In the present embodiment, the insert 308 has a diameter which is larger than the diameter of the substrate hole 211 to reduce the chance for arcing. In one embodiment of the present invention, the substrate support assembly 310 and support body 201 may comprise the support assembly 138 depicted in FIG. 1 with a substrate support body 124 that has been suitably adapted to include one or more recesses with an insert 308 for each recess. In one embodiment, the insert 308 may be made of aluminum oxide ($Al_2O_3$) (e.g., alumina). The insert 308 may be made of other ceramic materials or other materials which are electrically insulating. In yet other embodiments, the insert 308 may be made of anodized aluminum, or another conducting material which is coated with an insulating, dielectric material. In yet other embodiments, the insert 308 may be made of more than one material and have more than one type of coating.

Figure 4A:
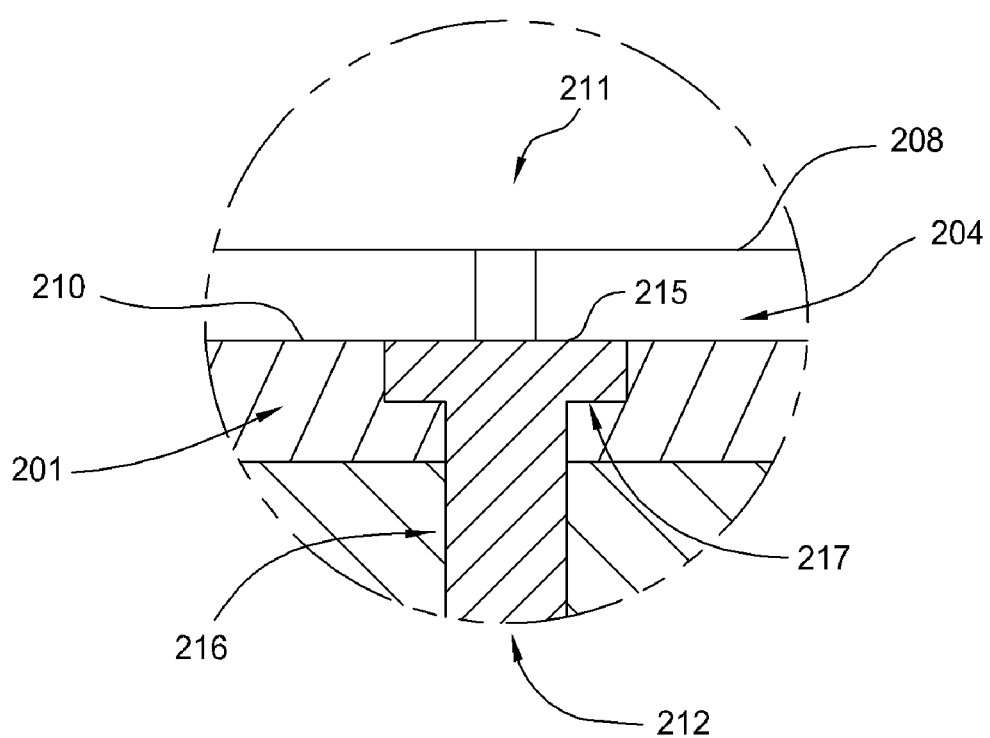
FIG. 4A is a detail view of one embodiment of FIG. 3B for the upper portion on an insulating insert, according to the present invention.

FIG. 4A is a detail view of one embodiment of FIG. 3B for the upper portion on an insulating insert, according to the present invention. The insert head 217 and stem 216 are shown in relation to a substrate 204 and substrate hole 211. The insert head 217 has a top surface 215 that is substantially flush with or slightly recessed from the top body surface 210 of the support body 201 so that the insert head 217 does not raise any portion of the substrate 204 from the top body surface 210 when the insert is seated within body 201.

Figure 4B:
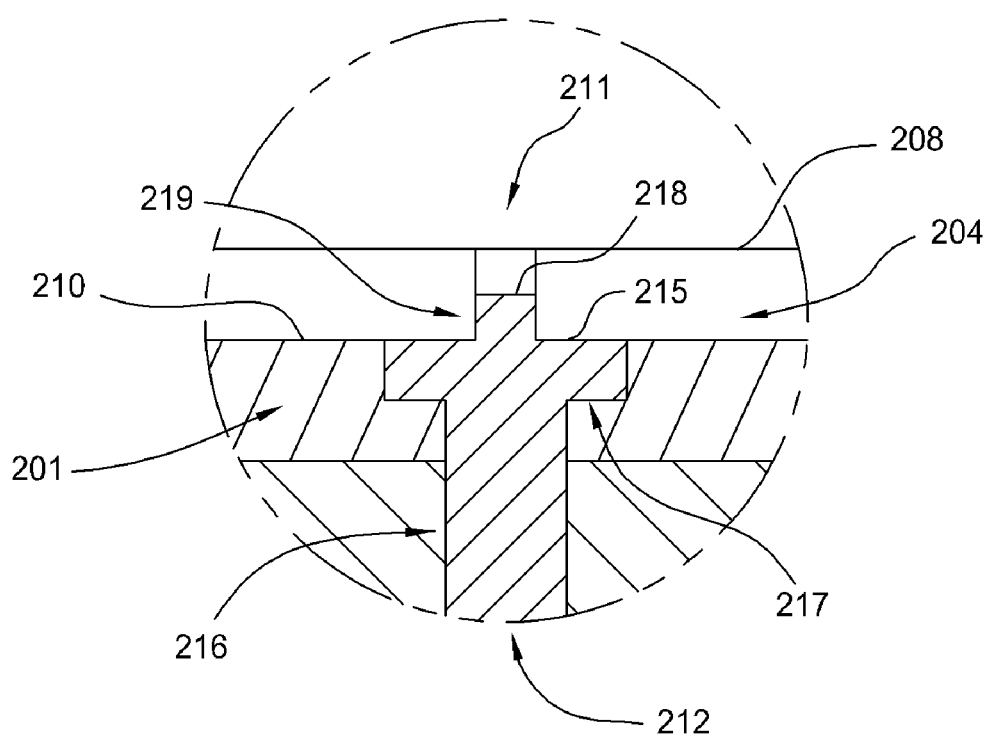
FIG. 4B is a detail view of another embodiment of FIG. 3B for the upper portion on an insulating insert, according to the present invention.

FIG. 4B is a detail view of another embodiment of FIG. 3B for the upper portion on an insulating insert 212, according to the present invention. In this embodiment, the head 217 of the insert 212 may include an insert pin 219 which is coupled to or integral with the head 217. The insert pin 219 may be cylindrical in shape with a diameter that is suitably sized to fit into the substrate hole 211 so that the substrate 204 can be placed onto or lifted from the support body 201. In one embodiment, one end of insert pin 219 is flush or slightly recessed from the top substrate surface 208 of the substrate 204. In other embodiments, the insert pin 219 may be recessed within the substrate hole 211 such that the pin surface 218 is below top substrate surface 208. In other embodiments, the insert pin 219 may have different shapes, sizes, and lengths. In the present embodiment, the insert pin 219 may be made of the same material used for the insert head 217. In other embodiments, the material used for the head may differ from the material used for the pin. In yet another embodiment, the insert pin 219 diameters and sizes and corresponding support body 201 hole diameters may vary from hole to hole when the substrate 204 includes multiple holes having different sizes.

Figure 4C:
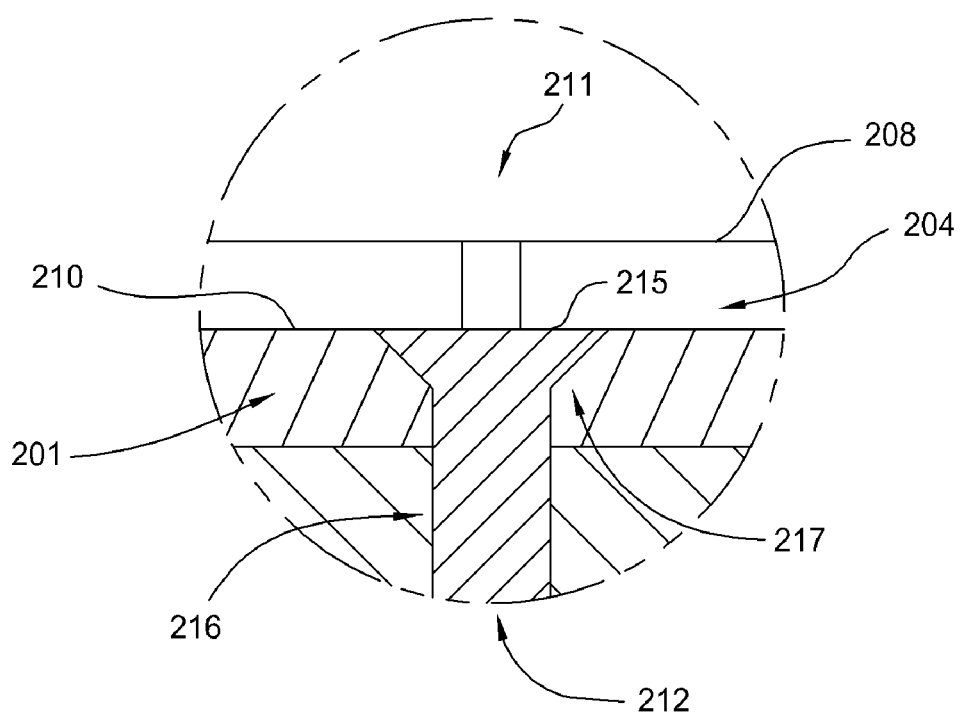
FIG. 4C is a detail view of another embodiment of FIG. 3B for the upper portion on an insulating insert, according to the present invention.

FIG. 4C is a detail view of another embodiment of FIG. 3B for the upper portion on an insulating insert 212, according to the present invention. In this embodiment, the head 217 has a countersink shape and the hole in the body 201 is adapted to receive this insert shape.

Figure 4D:
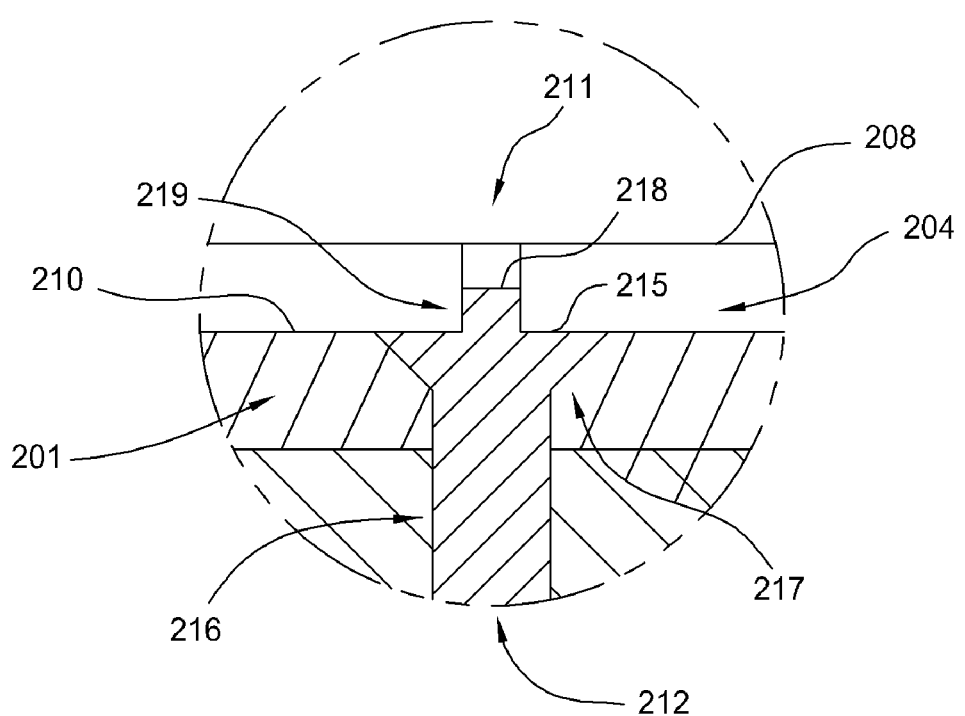
FIG. 4D is a detail view of another embodiment of FIG. 3B for the upper portion on an insulating insert, according to the present invention.

FIG. 4D is a detail view of another embodiment of FIG. 3B for the upper portion on an insulating insert 212, according to the present invention. In this embodiment, the head 217 has a countersink shape and includes an insert pin 219 which is coupled to or integral with the head 217. The insert pin 219 may be cylindrical in shape with a diameter that is suitably sized to fit into the substrate hole 211 so that the substrate 204 can be placed onto or lifted from the support body 201. In one embodiment, one end of insert pin 219 is flush or slightly recessed from the top substrate surface 208 of the substrate 204. In other embodiments, the insert pin 219 may be recessed within the substrate hole 211 such that the pin surface 218 is below top substrate surface 208. In other embodiments, the insert pin 219 may have different shapes, sizes, and lengths. In the present embodiment, the insert pin 219 may be made of the same material used for the insert head 217. In other embodiments, the material used for the head may differ from the material used for the pin. In yet another embodiment, the insert pin 219 diameters and sizes and corresponding support body 201 hole diameters may vary from hole to hole when the substrate 204 includes multiple holes having different sizes.

Figure 4E:
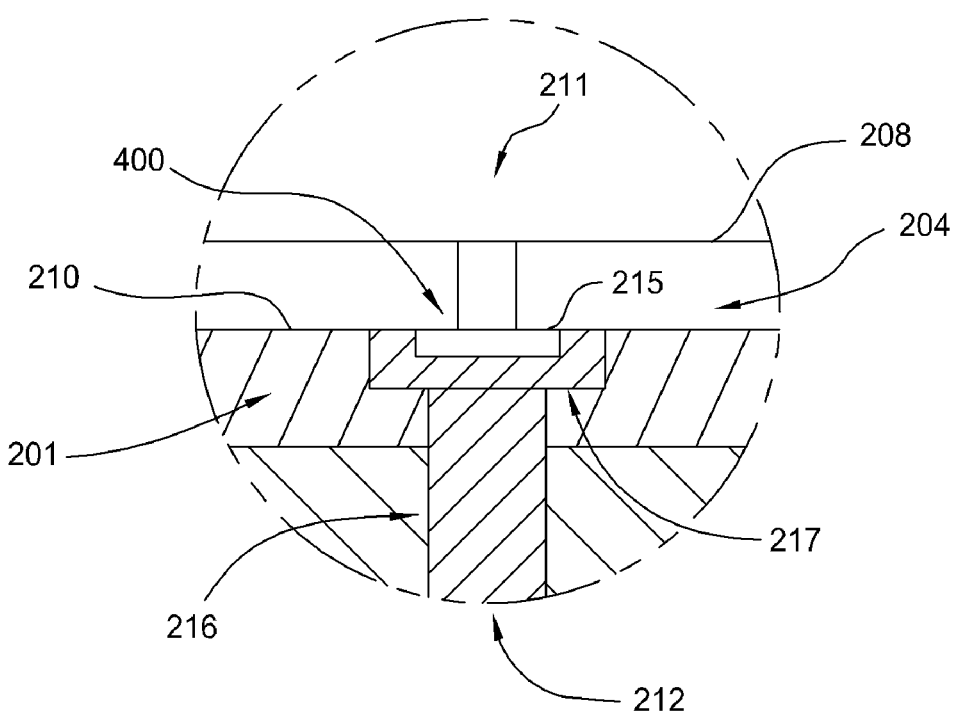
FIG. 4E is a detail view of another embodiment of FIG. 3B for the upper portion on an insulating insert, according to the present invention.

FIG. 4E is a detail view of another embodiment of FIG. 3B for the upper portion on an insulating insert 212, according to the present invention. In the present embodiment, the head 217 has a recess or counterbore 400 which is located beneath the substrate hole 211.

Figure 5A:
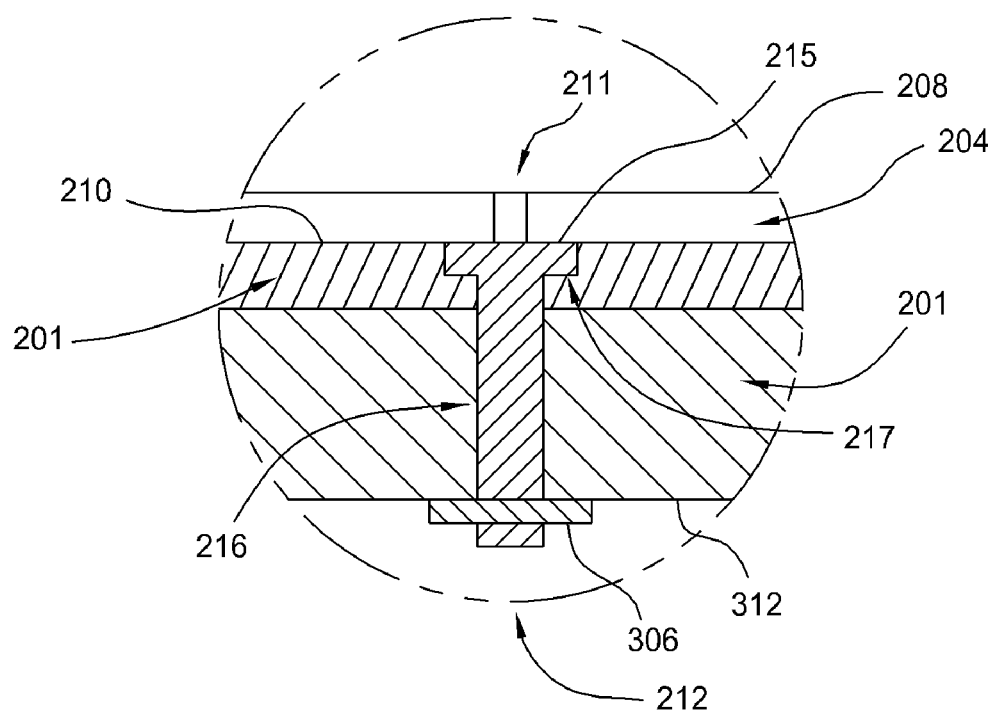
FIG. 5A is a detail view of one embodiment of FIG. 3C for an insulating insert, according to the present invention.

FIG. 5A is a detail view of one embodiment of FIG. 3C for the upper portion on an insulating insert, according to the present invention. The insert head 217 and stem 216 are shown in relation to a substrate 204 and substrate hole 211. The insert 212 may be suitably adapted to include a retaining pin 306 or other means for keeping the insert 212 coupled to the support body 201.

Figure 5B:
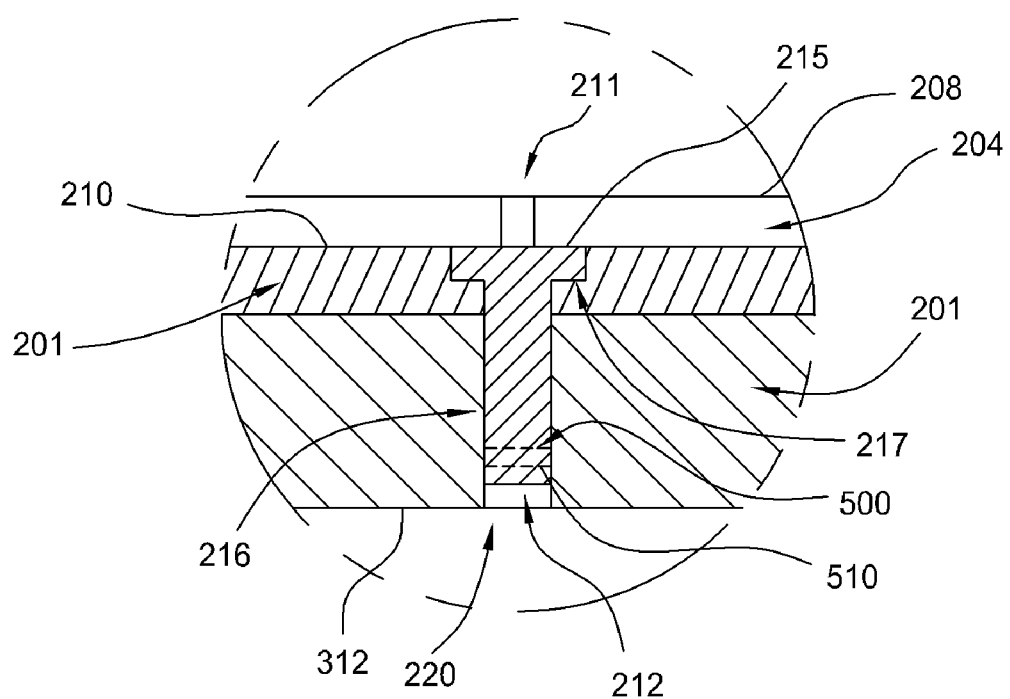
FIG. 5B is a detail view of another embodiment of FIG. 3C for an insulating insert, according to the present invention.

FIG. 5B is a detail view of another embodiment of FIG. 3C for an insulating insert 212, according to the present invention. In the present embodiment, the stem 216 has a recess or hole 500, and said hole or recess profile indicated by the dotted lines in FIG. 5B. The hole may be shaped or adapted to receive a weight (not shown) which may be embedded in or suitably attached to the hole 500. The weight may allow a shorter stem length to be used and help ensure that the insert will not rise out of the body 201 hole during substrate 204 lifting due to charging effects which may attract the insert to the substrate. In other embodiments, the weight (not shown) may be attached or coupled to the stem 216 by other means. In one embodiment, the weight may be made of anodized aluminum. In other embodiments, other materials may be used for the weight. In the present embodiment, the bottom surface 510 of the stem does not extend beyond the bottom surface 312 of body 201. In other embodiments, the surface 510 may extend beyond surface 312.

Figure 5C:
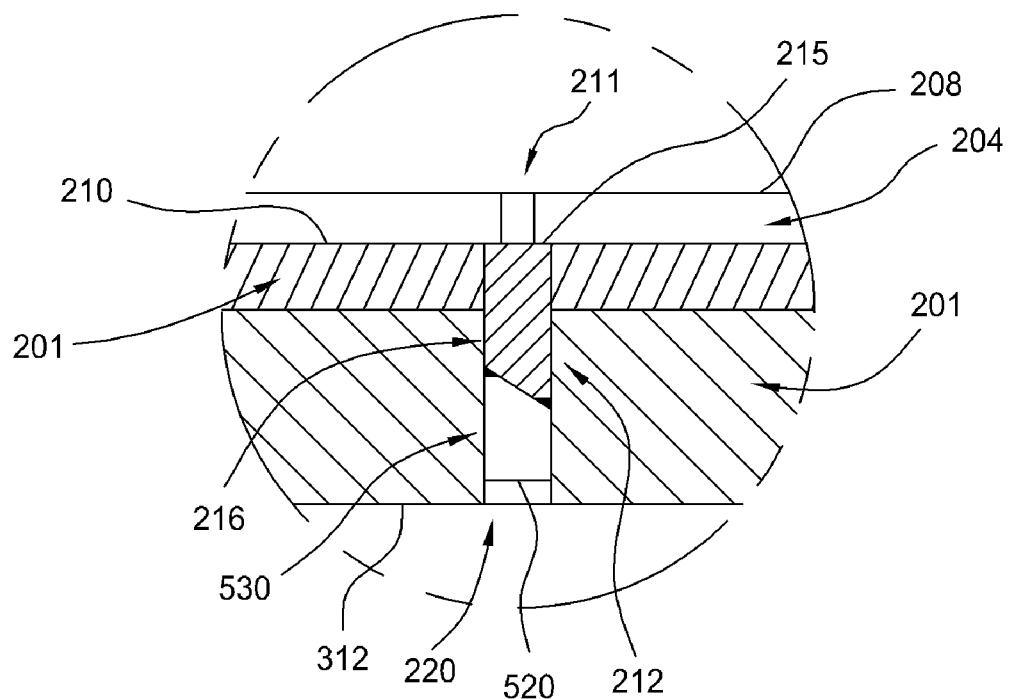
FIG. 5C is a detail view of another embodiment of FIG. 3C for an insulating insert, according to the present invention.

FIG. 5C is a detail view of another embodiment of FIG. 3C for an insulating insert, according to the present invention. In the present embodiment, the insert 212 has a constant circular cross-section and includes a stem 216 portion but not a head 217 portion. The stem has been suitably sized to fit the hole 220, and one end of the insert 212 is tapered. A wedge 530 is disposed in the hole 220 and the location of the wedge 530 in the hole 220 can be adjusted to raise or lower the top surface 215 of the insert 212. The wedge 530 also prevents the insert 212 from falling out of the hole 220. The wedge may be suitably sized to fit the hole 220 snugly so that the wedge 530 remains located within the hole 220. In one embodiment, the wedge 530 has a circular cross section with a tapered end that contacts the insert 212. In other embodiments, the wedge may have other shapes and cross-sections. In one embodiment, the wedge may be made of anodized aluminum. In other embodiments, other materials may be used for the wedge 530. In one embodiment, the wedge bottom surface 520 may be contained within hole 220. In other embodiments, the wedge bottom surface 520 may extend beyond bottom surface 312.

Figure 5D:
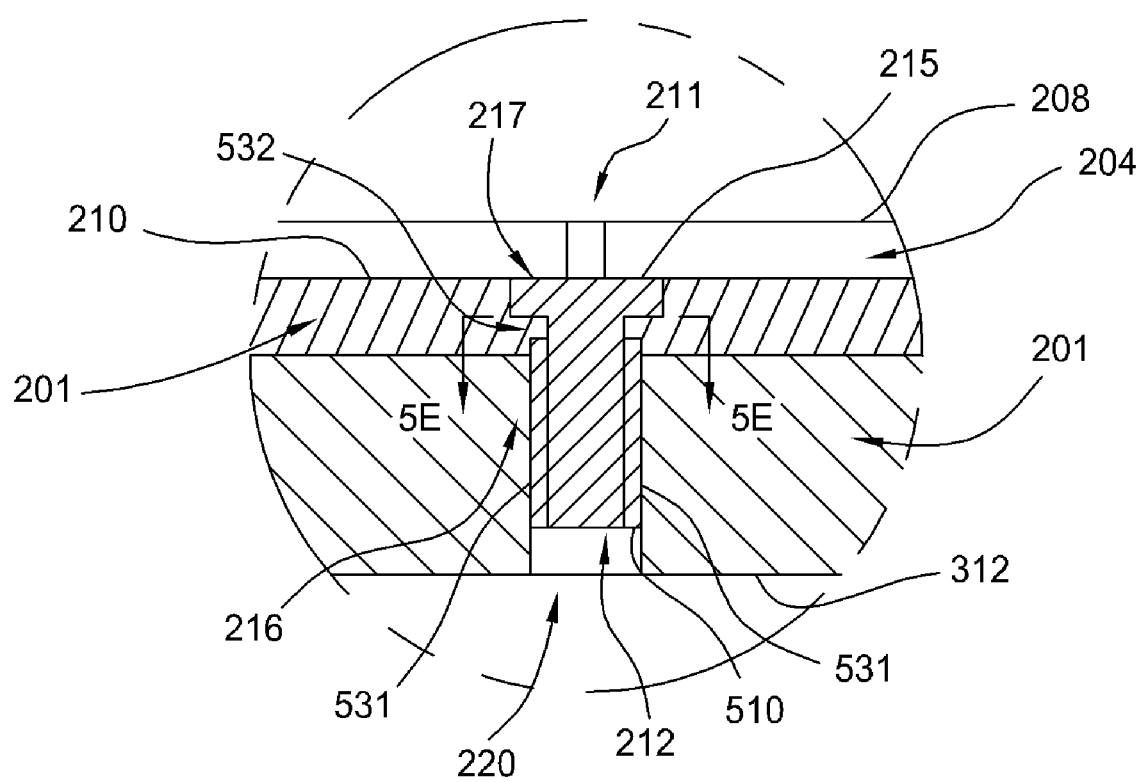
FIG. 5D is a detail view of another embodiment of FIG. 3C for an insulating insert, according to the present invention.

FIG. 5D is a detail view of another embodiment of FIG. 3C for an insulating insert, according to the present invention. In the present embodiment, the insert 212 is shaped so that the insert 212 may be retained in hole 220 using a key design. The insert has a stem 216 which is a shaft with two splines 531 on either side of the shaft. The shaft portion of the stem has a diameter D, and this diameter matches a hole 532 diameter in the body 201. When the insert 212 is properly aligned with hole 532, the insert will drop into the body hole 220. The insert 212 is then rotated so that the splines 531 engage with the body 201 at the location of the body hole 532. When the insert 212 is engaged with the body hole 532, the insert becomes coupled to the body 201. The insert can be removed by again rotating the insert so that the splines 531 are properly aligned with hole 532 profile, and then the insert can be lifted out of the body hole 220.

Figure 5E:
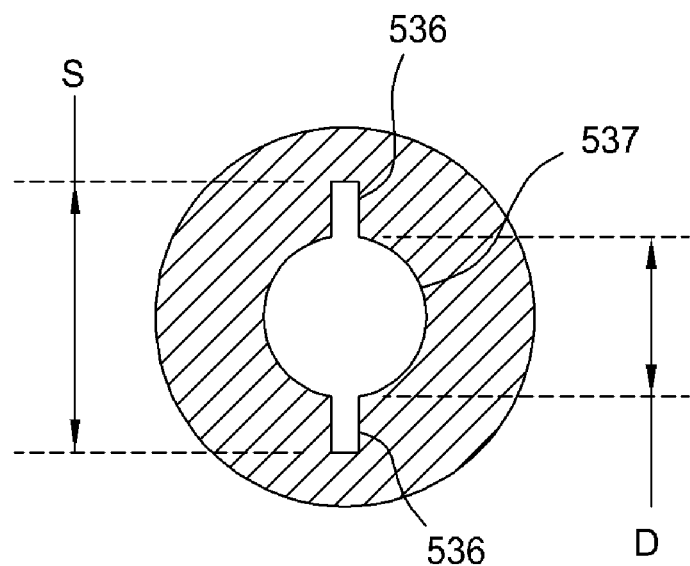
FIG. 5E is a cross-sectional view of key hole shown in FIG. 5D, according to the present invention.

FIG. 5E is a cross-sectional view of key hole shown in FIG. 5D, according to the present invention. For clarity, the insert 212 has been removed to show only the key hole 537 in body 201. A key hole 537 comprises a hole with diameter D and two slots 536 to receive splines 531. The slot diameter is S and is sized to receive the splines 531 shown in FIG. 5D. The diameter D is sized to receive the shaft diameter of the insert 212. In other embodiments, other key hole profiles may be used.

Figure 5F:
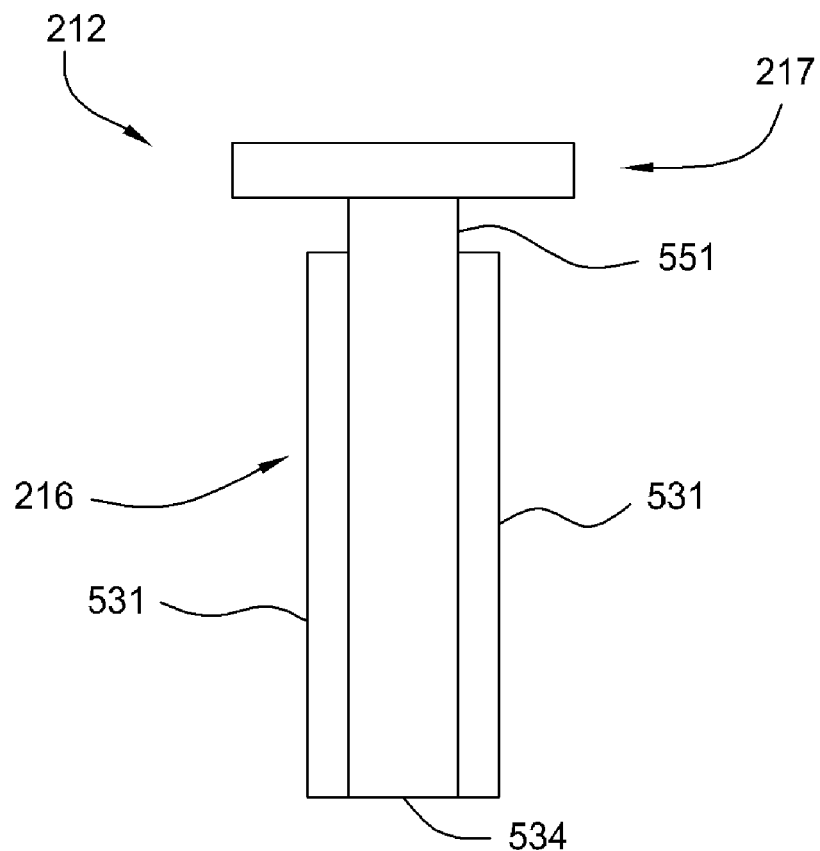
FIG. 5F is a side view of one embodiment for an insulating insert shown in FIG. 5D, according to the present invention.

FIG. 5F is a side view of one embodiment for an insulating insert shown in FIG. 5D, according to the present invention. The insert 212 includes a stem 216 which includes splines 531 on either side of a shaft 534. A gap 551 between head 217 and splines 531 allows the insert 212 to engage with the support body 201.

Figure 5G:
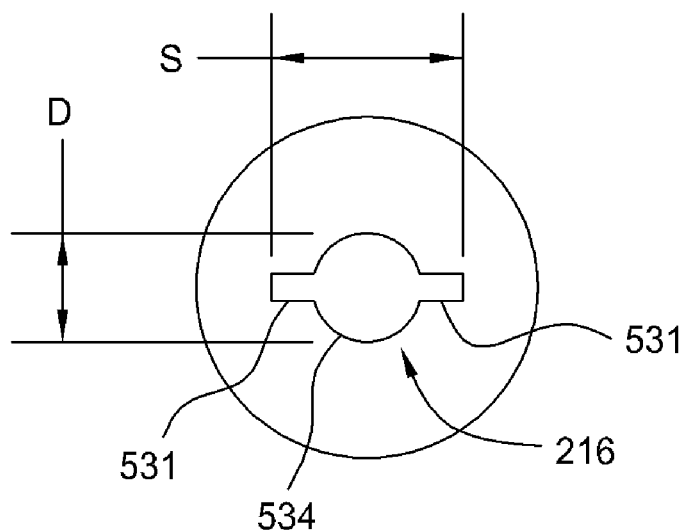
FIG. 5G is a bottom view of the insulating insert shown in FIG. 5F, according to the present invention.

FIG. 5G is a bottom view of the insulating insert shown in FIG. 5F, according to the present invention. In this view the cross-sectional profile of the stem 216 shows the key design. The stem 216 comprises a shaft 534 and two splines 531. The shaft 534 has a diameter D, and the spline diameter is S. In one embodiment, the splines 531 may be integral to the shaft 534. In another embodiment, the splines 531 may be coupled to the shaft 534. In other embodiments, different key designs may be used for the stem 216 and insert 212.

Figure 6A:
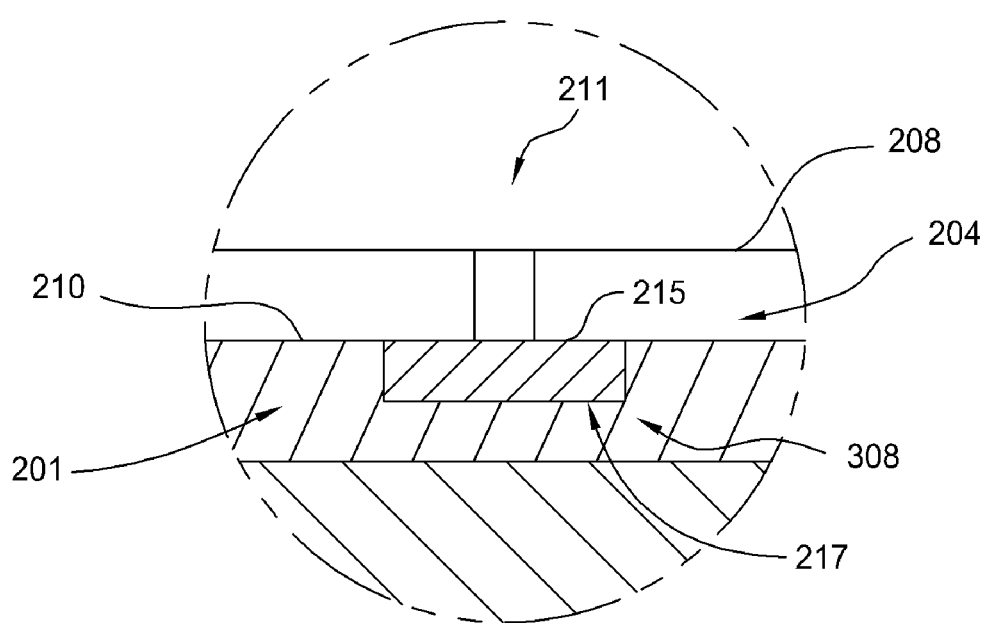
FIG. 6A is a detail view of one embodiment of FIG. 3D for the upper portion an insulating insert, according to the present invention.

FIG. 6A is a detail view of one embodiment of FIG. 3D for the upper portion an insulating insert, according to the present invention. In the present embodiment, the insert 308 comprises a head 217 but does not include a stem 216. The insert head 308 is shown in relation to a substrate 204, body 201, and substrate hole 211.

Figure 6B:
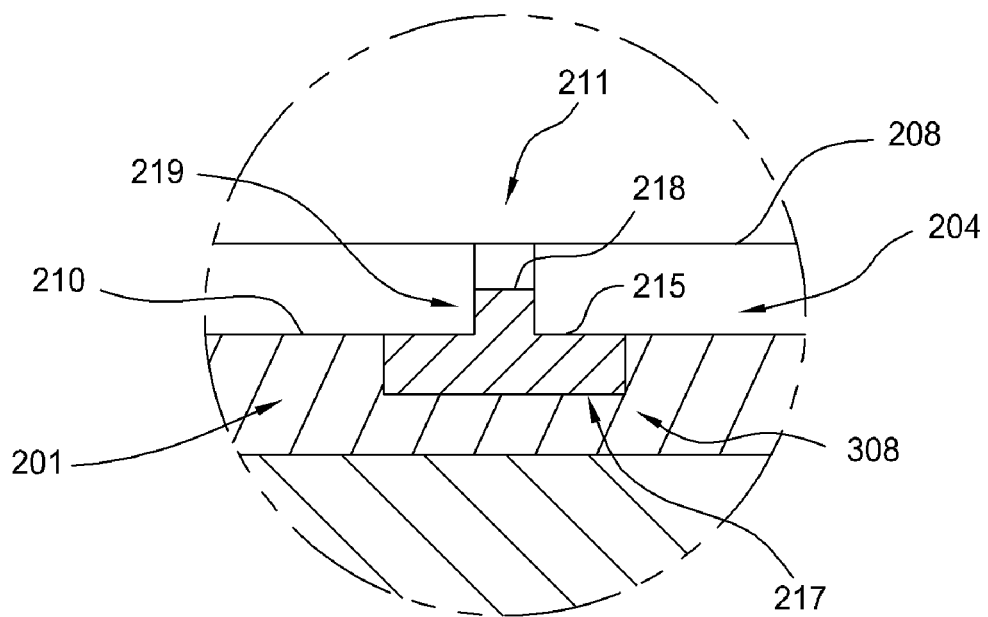
FIG. 6B is a detail view of another embodiment of FIG. 3D for the upper portion of an insulating insert, according to the present invention.

FIG. 6B is a detail view of another embodiment of FIG. 3D for the upper portion of an insulating insert 308, according to the present invention. In this embodiment, the head 217 of the insert 308 may include an insert pin 219 which is coupled to or integral with the head 217. The insert pin 219 may be cylindrical in shape with a diameter that is suitably sized to fit into the substrate hole 211 so that the substrate 204 can be placed onto or lifted from the support body 201. In one embodiment, one end of insert pin 219 is flush or slightly recessed from the top substrate surface of the substrate 204. In other embodiments, the insert pin 219 may be recessed within the substrate hole 211 such that the pin surface 218 is below top substrate surface 208. In other embodiments, the insert pin 219 may have different shapes, sizes, and lengths. In the present embodiment, the insert pin 219 may be made of the same material used for the insert head 217. In other embodiments, the material used for the head may differ from the material used for the pin. In yet another embodiment, the insert pin 219 diameters and sizes and corresponding support body 201 hole diameters may vary from hole to hole when the substrate 204 includes multiple holes having different sizes.

Figure 6C:
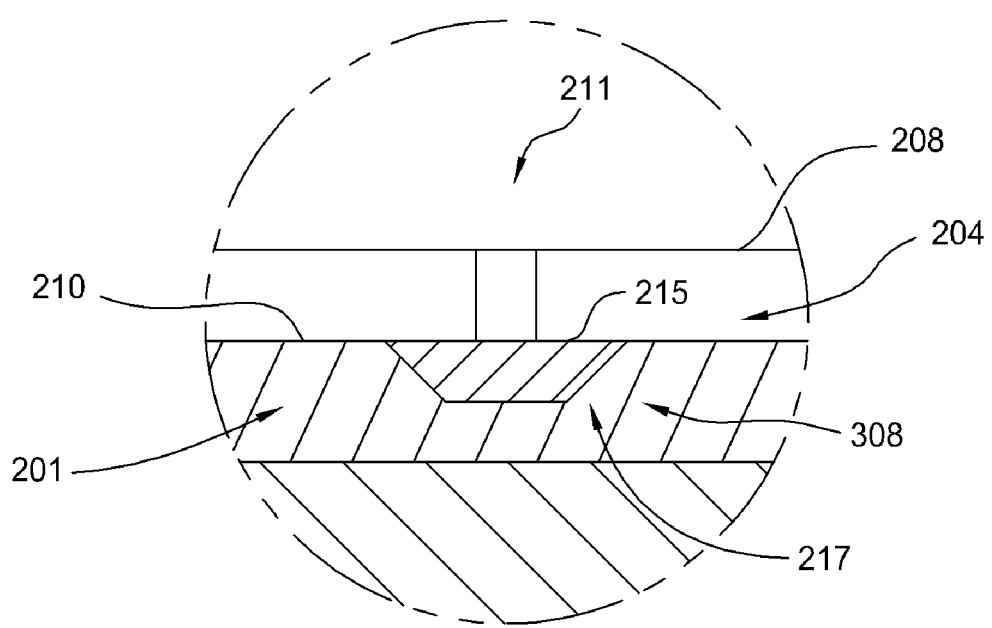
FIG. 6C is a detail view of another embodiment of FIG. 3D for the upper portion of an insulating insert, according to the present invention.

FIG. 6C is a detail view of another embodiment of FIG. 3D for the upper portion of an insulating insert 308, according to the present invention. In this embodiment, the head 217 has a countersink shape and the hole in the body 201 is adapted to receive this insert shape.

Figure 6D:
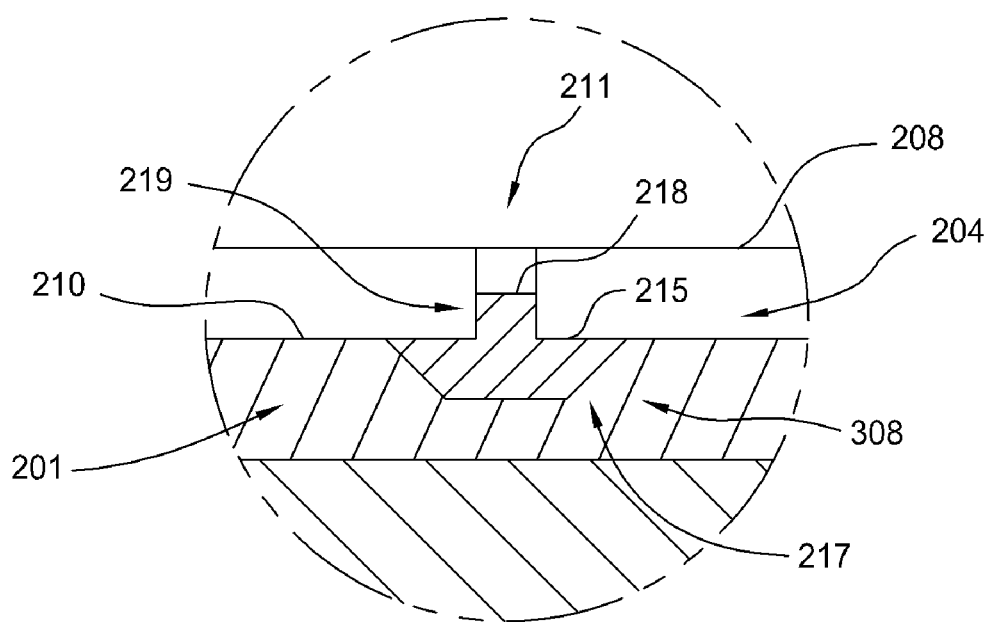
FIG. 6D is a detail view of another embodiment of FIG. 3D for the upper portion of an insulating insert, according to the present invention.

FIG. 6D is a detail view of another embodiment of FIG. 3D for the upper portion of an insulating insert 308, according to the present invention. In this embodiment, the head 217 has a countersink shape and includes an insert pin 219 which is coupled to or integral with the head 217. The insert pin 219 may be cylindrical in shape with a diameter that is suitably sized to fit into the substrate hole 211 so that the substrate 204 can be placed onto or lifted from the support body 201. In one embodiment, one end of insert pin 219 is flush or slightly recessed from the top substrate surface 208 of the substrate 204. In other embodiments, the insert pin 219 may be recessed within the substrate hole 211 such that the pin surface 218 is below top substrate surface 208. In other embodiments, the insert pin 219 may have different shapes, sizes, and lengths. In the present embodiment, the insert pin 219 may be made of the same material used for the insert head 217. In other embodiments, the material used for the head may differ from the material used for the pin. In yet another embodiment, the insert pin 219 diameters and sizes and corresponding support body 201 hole diameters may vary from hole to hole when the substrate 204 includes multiple holes having different sizes.

Figure 6E:
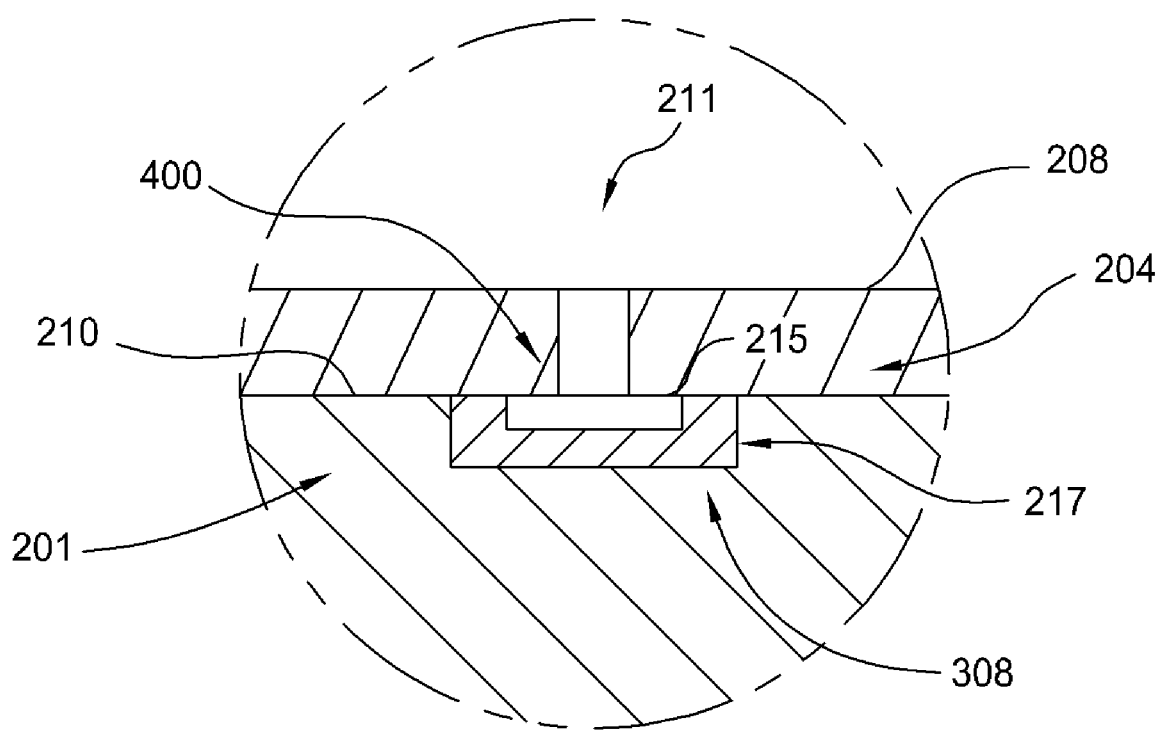
FIG. 6E is a detail view of another embodiment of FIG. 3D for the upper portion of an insulating insert, according to the present invention.

FIG. 6E is a detail view of another embodiment of FIG. 3D for the upper portion of an insulating insert 308, according to the present invention. In the present embodiment, the head 217 has a recess or counterbore 400 which is located beneath the substrate hole 211.

FIG. 7A is a side view of one embodiment for an insulating insert 212, according to the present invention. The insert 212 comprises a head 217 and stem 216. The head 217 is flat in shape, and both the head and stem have circular cross sections. In one embodiment, the head 217 may have a diameter D2 of about 10 mm, the stem 216 length L may have a value of about 41 mm, and the stem 216 diameter D1 may have a value of about 6 mm. In another embodiment, the head 217 may have a diameter D2 ranging from about 1 mm to about 300 mm, the stem 216 length L may range from about 1 mm to about 100 mm, and the stem 216 diameter D1 may have a value ranging from about 1 mm to about 100 mm.

FIG. 7B is a plan view of the insulating insert 212 shown in FIG. 7A. The outer circle indicates the circular head 217 cross section, and the dotted, inner circle indicates the circular stem 216 cross section. In other embodiments, the insert cross sections may be hexagonal, oval, rectangular, or have some other shape.

FIG. 7C is a side view of another embodiment for an insulating insert, according to the present invention. The insert 212 comprises a head 217, a stem 216, and a insert pin 219. The head, stem and pin have circular cross sections.

FIG. 7D is a plan view of the insulating insert shown in FIG. 7C. The outer circle indicates the circular head 217 cross section, the dotted circle indicates the circular stem 216 cross section, and the inner solid circle indicates the insert pin 219 cross section. In other embodiments, each of these insert 212 cross sections may be hexagonal, oval, rectangular, or have some other shape.

FIG. 7E is a side view of another embodiment for an insulating insert, according to the present invention. The insert 212 comprises a head 217 and stem 216. The head 217 has a countersink shape, and both the head and stem have circular cross sections.

FIG. 7F is a plan view of the insulating insert 212 shown in FIG. 7E. The outer circle indicates the circular head 217 cross section, and the dotted, inner circle indicates the circular stem 216 cross section. In other embodiments, the insert cross sections may be hexagonal, oval, rectangular, or have some other shape.

FIG. 7G is a side view of another embodiment for an insulating insert, according to the present invention. The insert 212 comprises a head 217, a stem 216, and a insert pin 219. The head 217 has a countersink shape, and the head, pin, and stem have circular cross sections.

FIG. 7H is a plan view of the insulating insert 212 shown in FIG. 7G. The outer circle indicates the circular head 217 cross section, the dotted circle indicates the circular stem 216 cross section, and the inner solid circle indicates the insert pin 219 cross section. In other embodiments, each of these insert 212 cross sections may be hexagonal, oval, rectangular, or have some other shape.

FIG. 7I is a side view of another embodiment for an insulating insert, according to the present invention. The insert 212 comprises a head 217 and stem 216. The head 217 is flat in shape, and includes a counterbore 400. Both the head and stem have circular cross sections.

FIG. 7J is a plan view of the insulating insert shown in FIG. 7I. The outer circle indicates the circular head 217 cross section, the dotted circle indicates the circular stem 216 cross section, and the inner solid circle indicates the counterbore 400 cross section. In other embodiments, each of these insert 212 cross sections may be hexagonal, oval, rectangular, or have some other shape.

FIG. 7K is a side view of another embodiment for an insulating insert, according to the present invention. The insert 212 comprises a stem 216 but has no head portion. The stem is tapered at one end, with a blunt end surface 702. In one embodiment, the taper surface 700 may be angled at 30 degrees with respect to surface 701. In other embodiments, other angles may be used. The stem has circular cross section.

FIG. 7L is a plan view of the insulating insert shown in FIG. 7K. The outer circle indicates the stem 216 cross section, the dotted circle indicates the taper surface 700, and the other dotted circle indicates the blunt end surface 702. In other embodiments, each of these insert 212 cross sections may be hexagonal, oval, rectangular, or have some other shape.

FIG. 8A is a side view of one embodiment for an insulating insert which has no stem, according to the present invention. In the present embodiment, the insert 308 includes a head portion 217 only, and does not include a stem 216. The head 217 is flat and has a circular cross section.

FIG. 8B is a plan view of the insulating insert 308 shown in FIG. 8A. The circle indicates the circular head 217 cross section. In other embodiments, the insert 308 cross section may be hexagonal, oval, rectangular, or have some other shape.

FIG. 8C is a side view of another embodiment for an insulating insert which has no stem, according to the present invention. In the present embodiment, the insert 308 comprises a head portion 217 and a insert pin 219, and the head 217 and insert pin 219 have circular cross sections.

FIG. 8D is a plan view of the insulating insert shown in FIG. 8C. The outer circle indicates the circular head 217 cross section, and the inner solid circle indicates the insert pin 219 cross section. In other embodiments, each of these insert 308 cross sections may be hexagonal, oval, rectangular, or have some other shape.

FIG. 8E is a side view of another embodiment for an insulating insert which has no stem, according to the present invention. In the present embodiment, the insert 308 comprises a head portion 217, and the head 217 has a countersink shape with a circular cross section.

FIG. 8F is a plan view of the insulating insert shown in FIG. 8E. The outer circle indicates the circular head 217 cross section, and the inner dotted circle 800 indicates the smaller diameter cross section of the head. In other embodiments, each of these insert 308 cross sections may be hexagonal, oval, rectangular, or have some other shape.

FIG. 8G is a side view of another embodiment for an insulating insert which has no stem, according to the present invention. The insert 308 comprises a head 217 and a insert pin 219. The head 217 has a countersink shape, and the head, pin, and stem have circular cross sections.

FIG. 8H is a plan view of the insulating insert shown in FIG. 8G. The outer circle indicates the circular head 217 cross section, the dotted circle 801 indicates the smaller diameter for the countersink head 217, and the inner solid circle indicates the insert pin 219 cross section. In other embodiments, each of these insert 308 cross sections may be hexagonal, oval, rectangular, or have some other shape.

FIG. 8I is a side view of another embodiment for an insulating insert which has no stem, according to the present invention. The insert 308 comprises a head 217 and a counterbore 400. The head 217 is flat in shape and has a circular cross section.

FIG. 8J is a plan view of the insulating insert shown in FIG. 8I. The outer circle indicates the circular head 217 cross section, and the inner solid circle indicates the counterbore 400 cross section. In other embodiments, each of these insert 308 cross sections may be hexagonal, oval, rectangular, or have some other shape.

While the foregoing is directed to embodiments of the present invention, other and further embodiments of the invention may be devised without departing from the basic scope thereof, and the scope thereof is determined by the claims that follow.

We claim:

1. A substrate support adapted to support a substrate, the substrate support comprising:
    an electrically conductive body having a substrate support surface, a plurality of lift pin holes, and at least one insert hole;
    an electrically insulating coating disposed on the conductive body;
    a lift pin disposed within each of the plurality of lift pin holes; and
    at least one electrically insulating insert disposed within the at least one insert hole in the conductive body, wherein the at least one insert hole in the conductive body has a shallow recess on the conductive body substrate support surface and the at least one electrically insulating insert is disposed within the shallow recess on the conductive body substrate support surface, wherein the electrically insulating insert is not a lift pin, and wherein the at least one electrically insulating insert has a top surface that is substantially flush with or recessed from the substrate supporting surface of the electrically conductive body.

2. The substrate support of claim 1, further comprising:
    a plurality of electrically insulating inserts, wherein the conductive body has a plurality of insert holes, and wherein each electrically insulating insert is disposed within a respective insert hole in the conductive body.

3. The substrate support of claim 1, wherein the electrically conductive body is at least partially fabricated from aluminum and the coating is an anodization layer.

4. The substrate support of claim 1, wherein the at least one electrically insulating insert is made of aluminum oxide.

5. The substrate support of claim 1, wherein the at least one electrically insulating insert is coupled to the conductive body using a retaining pin.

6. The substrate support of claim 1, wherein the at least one electrically insulating insert is made of anodized aluminum.

7. The substrate support of claim 1, wherein:
the conductive body has a bottom surface;
the at least one electrically insulating insert has a first length;
the at least one insert hole in the conductive body in which the at least one electrically insulating insert is disposed has a second length; and
the first length is greater than the second length, such that a portion of the at least one electrically insulating insert extends beyond the bottom surface of the conductive body.

8. The substrate support of claim 1, wherein the substrate has an area greater than 2000 square centimeters.

9. The substrate support of claim 1, wherein:
the support body has a bottom surface; and
the at least one hole in the substrate support body does not extend to the bottom surface.

10. A plasma processing chamber adapted to process a substrate, the plasma processing chamber comprising:
one or more walls forming a processing volume;
a substrate support disposed in the processing volume;
a substrate support body having a substrate support surface, a plurality of lift pin holes, and at least one insert hole, the substrate support body being disposed in the processing volume;
a lift pin disposed within each of the plurality of lift pin holes; and
at least one electrically insulating insert disposed within the at least one insert hole in the support body, wherein the at least one insert hole in the substrate support body has a shallow recess on the substrate support surface and the at least one electrically insulating insert is disposed within the shallow recess on the substrate support surface, wherein the electrically insulating insert is not a lift pin, and wherein the at least one electrically insulating insert has a top surface that is substantially flush with or recessed from the substrate supporting surface of the electrically conductive body.

11. The chamber of claim 10, further comprising:
a plurality of electrically insulating inserts, wherein the support body has a plurality of insert holes, and wherein each electrically insulating insert is disposed within a respective insert hole in the support body.

12. The chamber of claim 10, wherein the support body is at least partially fabricated from aluminum and includes a coating, the coating comprising an anodization layer.

13. The chamber of claim 10, wherein the substrate has an area greater than 2000 square centimeters.

14. The chamber of claim 10, wherein the at least one electrically insulating insert is made of aluminum oxide.

15. The chamber of claim 10, wherein the at least one electrically insulating insert is made of anodized aluminum.

16. The chamber of claim 10, wherein:
the support body has a bottom surface;
the at least one electrically insulating insert has a first length;
the at least one insert hole in the support body has a second length; and
the first length is greater than the second length, such that a portion of the at least one electrically insulating insert extends beyond the bottom surface of the support body.

17. The chamber of claim 10, wherein:
the support body has a bottom surface; and
the at least one hole in the substrate support body does not extend to the bottom surface.

* * * * *